(12) United States Patent
Miller

(10) Patent No.: US 12,292,464 B2
(45) Date of Patent: May 6, 2025

(54) SYSTEM AND METHOD FOR THE AUTOMATED VALIDATION OF A SEMI-ANECHOIC CHAMBER

(71) Applicant: Phillip C. Miller, Tempe, AZ (US)

(72) Inventor: Phillip C. Miller, Tempe, AZ (US)

(*) Notice: Subject to any disclaimer, the term of this patent is extended or adjusted under 35 U.S.C. 154(b) by 0 days.

(21) Appl. No.: 18/407,253

(22) Filed: Jan. 8, 2024

(65) Prior Publication Data

US 2024/0142507 A1 May 2, 2024

Related U.S. Application Data

(63) Continuation of application No. 18/162,661, filed on Jan. 31, 2023, now Pat. No. 11,867,739, which is a continuation of application No. 17/878,733, filed on Aug. 1, 2022, now Pat. No. 11,567,115.

(51) Int. Cl.
| | |
|---|---|
| *G01R 27/04* | (2006.01) |
| *G01B 11/06* | (2006.01) |
| *G01C 3/00* | (2006.01) |
| *G01R 29/10* | (2006.01) |

(52) U.S. Cl.
CPC ........ *G01R 29/105* (2013.01); *G01B 11/0608* (2013.01); *G01C 3/00* (2013.01)

(58) Field of Classification Search
CPC .............. G01R 29/105; G01R 29/0821; G01R 29/0828; G01R 29/0878; G01R 29/10; G01R 29/0814; G01R 29/0892; G01R 29/0871; G01R 31/001; G01R 1/0018; G01B 11/0608; G01C 3/00
See application file for complete search history.

(56) References Cited

U.S. PATENT DOCUMENTS

| | | |
|---|---|---|
| 5,532,704 A | 7/1996 | Ruelle |
| 8,547,284 B2 | 10/2013 | Kim |
| 8,971,821 B2 * | 3/2015 | Schlub ............... G01R 29/0857 455/67.11 |
| 2008/0129615 A1 | 6/2008 | Breit |
| 2009/0219217 A1 | 9/2009 | Kitada |
| 2011/0084887 A1 | 4/2011 | Mow |
| 2013/0335253 A1 | 12/2013 | Ho |

(Continued)

*Primary Examiner* — Thang X Le
(74) *Attorney, Agent, or Firm* — Pacer K. Udall; Booth Udall Fuller, PLC

(57) ABSTRACT

A system for the automated validation of a semi-anechoic chamber (SAC) is disclosed. The system includes a receive assembly and a transmit assembly, each configured to autonomously relocate within the SAC. The system also includes a local client communicatively coupled to the transmit assembly. The local client is configured to send a validation arrangement to the transmit assembly describing a validation location and a distance. The transmit assembly is configured to receive the validation arrangement, move the transmit assembly to the validation location and send an instruction to the receive assembly, the instruction describing the distance. The receive assembly is communicatively coupled to the transmit assembly and configured to receive the instruction and move the receive assembly such that a separation between the transmit and receive assemblies is restored to the distance. Each validation arrangement corresponds to a validation point. A plurality of validation points defines a test volume.

20 Claims, 13 Drawing Sheets

(56) References Cited

U.S. PATENT DOCUMENTS

| | | | |
|---|---|---|---|
| 2014/0141726 A1* | 5/2014 | Schlub | G01R 29/0871 455/67.12 |
| 2016/0138946 A1* | 5/2016 | Grau | G01D 5/48 342/361 |
| 2017/0242129 A1* | 8/2017 | Kallankari | G01R 29/0821 |
| 2019/0187199 A1 | 6/2019 | Mellein | |
| 2020/0220628 A1 | 7/2020 | Vella-Coleiro | |
| 2021/0028869 A1 | 1/2021 | Hao | |
| 2021/0148959 A1* | 5/2021 | Rowell | H04B 17/382 |
| 2021/0247431 A1* | 8/2021 | Maruo | G01R 29/0871 |
| 2022/0236316 A1 | 7/2022 | Nakamura | |

* cited by examiner

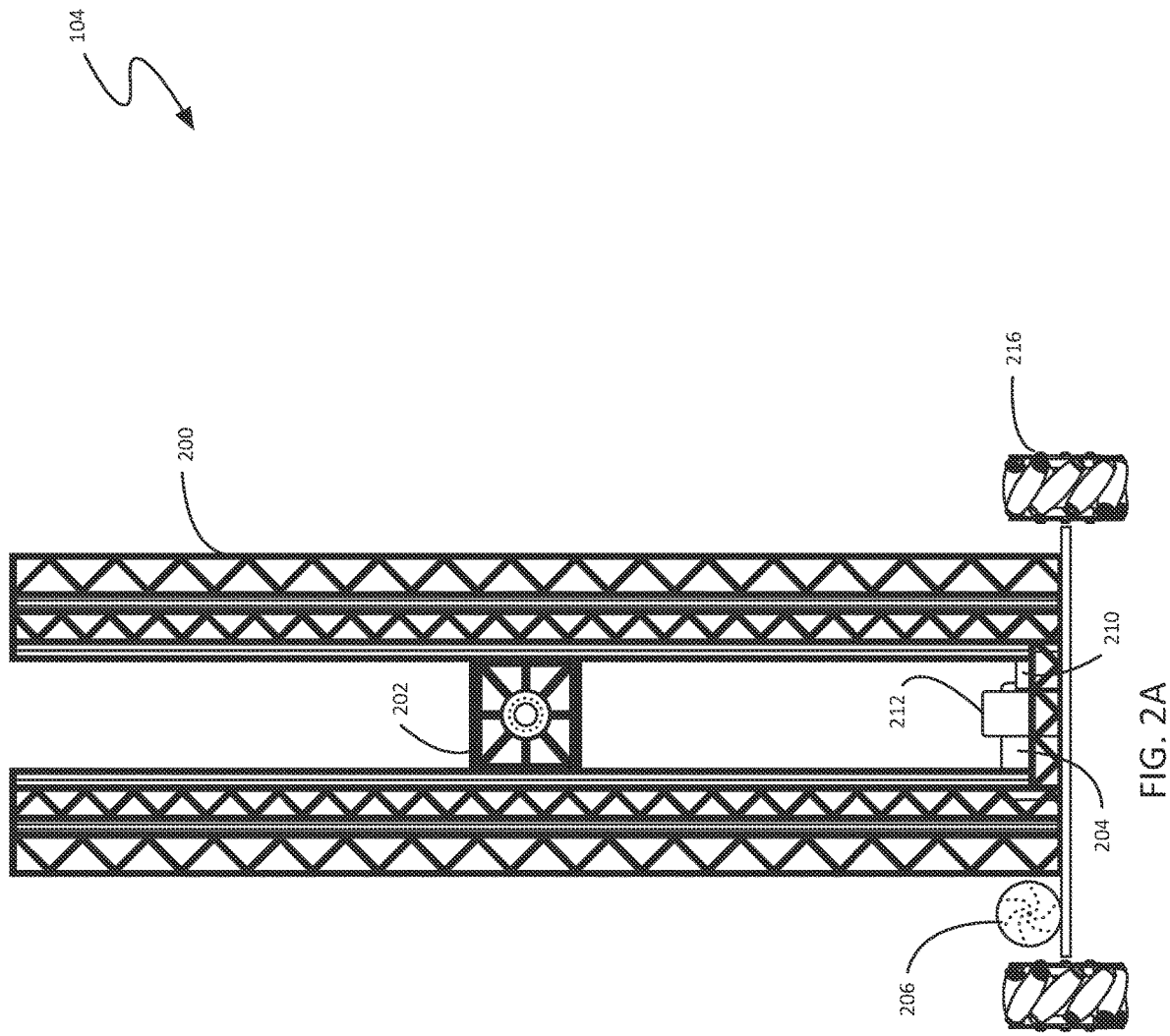

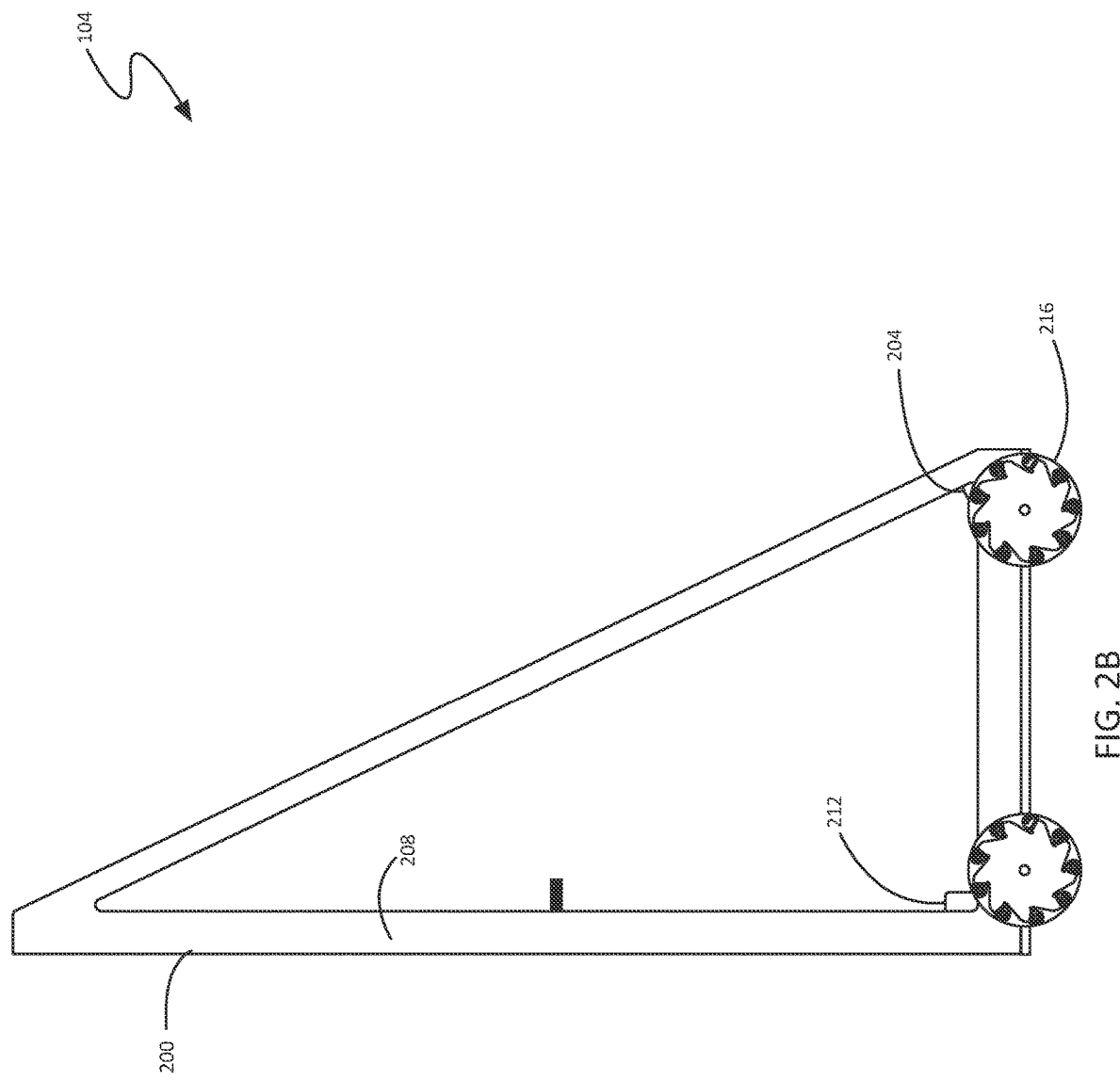

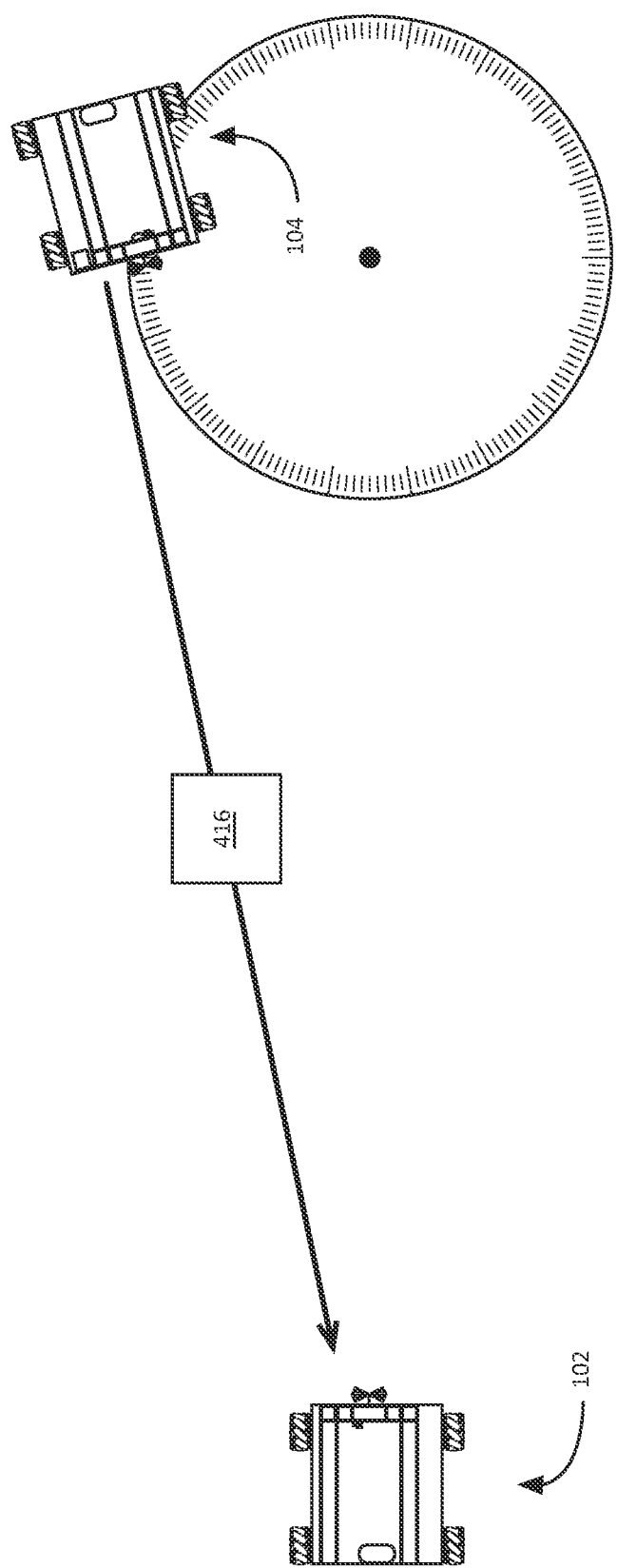

SYSTEM AND METHOD FOR THE AUTOMATED VALIDATION OF A SEMI-ANECHOIC CHAMBER

CROSS REFERENCE TO RELATED APPLICATIONS

This application claims priority to, and is a continuation of, U.S. patent application Ser. No. 18/162,661 filed Jan. 31, 2023, issuing as U.S. Pat. No. 11,867,739, which application claims priority to, and is a continuation of, U.S. patent application Ser. No. 17/878,733 filed Aug. 1, 2022, issued as U.S. Pat. No. 11,567,115, the entirety of the disclosures of which are hereby incorporated herein by this reference.

TECHNICAL FIELD

Aspects of this document relate generally to the validation of semi-anechoic chambers.

BACKGROUND

All electrical devices in the world must be approved by the government of the country in which they operate. Laws have established requirements for testing to regulatory standards, such as those of the FCC (US) or CE (European Union). Test equipment used for this testing must be traceable and shown to meet international reference standards. Additionally, all testing must be accredited by an independent agency. These tests are typically done at unique test stations using specialized test equipment.

The most utilized test station in a lab, and where most regulatory failures happen, is the "semi-anechoic chamber" (SAC). A semi-anechoic chamber is a large metal box, typically 5-15 m long and 5 m tall. The interior walls and ceiling are covered in absorbers made of foam or other materials. Within the SAC, electrical signals are absorbed by the walls rather than bouncing off of them. The purpose of this chamber is to simulate a perfect ground surface with an infinite volume in 3 dimensions. On one end of the chamber is a large turntable (0.5-6 m diameter) for rotating the "equipment under test" (EUT). On the opposite end is an antenna on a mast for measuring the electrical noise emitting from the EUT. The turntable rotates, allowing the EUT to be measured from all directions.

In order for test results from a SAC to be used for the regulatory certification of devices, the SAC must be validated or characterized to meet a standard. For example, one type of validation must show that the environment within the SAC sufficiently approximates that perfect ground plane beneath an infinite three-dimensional volume. Traditionally, this validation is performed using a transmitter and a receiver, each mounted on masts. The transmit mast is placed at different positions within the volume or "quiet zone" being validated, a volume that is typically centered on the turntable. At each of those positions, a standing wave inside the chamber is examined. For example, the transmit mast may be placed at the four cardinal points of the turntable, and the center. The transmit mast may also be placed at different heights. The receive mast is moved so it is always separated from the transmit mast by the same distance (e.g., 3 m, etc.). For each point, a signal is sent between the masts, and then they are moved slightly to examine the standing wave (e.g., 6 points at each location to validate at 18 GHz, etc.). The SAC is validated if the differences in signal strength at the different points do not exceed a limit (i.e., a regulatory limit).

The traditional methods for validation are problematic for a number of reasons. Validation of an SAC is expensive. Unlike most pieces of test equipment, the SAC cannot be packaged and shipped back to the manufacturer for annual calibration and correction. Instead, on an annual basis, a characterization of the chamber is accomplished by accredited professionals over several days. In many cases, the cost of the validation is increased due to the expenses related to travel and housing for those accredited professionals for days or weeks at a time.

The procedure itself is time consuming. The masts are moved manually to their various positions. Each measurement point performed within the quiet zone requires the technician to unseal the door, enter the chamber, move the transmit mast, move the receive mast, measure the separation between the masts and adjust to ensure the separation stays the same, leave and seal the chamber, and take a reading. This is a time consuming process that gets repeated for each position, height, and polarity. As a specific example, five locations at two heights tor both polarities, taken at six linear alterations to probe an 18 GHz standing wave means the technician is repeating this process 120 times. Each measurement can take up to five minutes, which adds up to many hours. This tedious process also provides many opportunities for error. The distance measurements are typically performed manually using tape measures, to reduce the amount of reflective materials within the chamber. The validation of a single SAC can cost tens of thousands of dollars, or more.

The semi-anechoic chamber is usually the largest, most costly, and most utilized test station in a lab. These chambers can cost millions of dollars; any downtime for validation is time the chamber is not earning and recouping that large cost. Additionally, a failed validation can call into question all of the test results produced by that chamber since its last validation. Because conventional methods are so expensive and slow, the time between validations can be long (e.g., annual validation), risking a large number of test results and additional lost revenue.

SUMMARY

The following and other aspects, features, and advantages will be apparent to those artisans of ordinary skill in the art from the DESCRIPTION, DRAWINGS, and CLAIMS.

According to one aspect, a system for the automated validation of a semi-anechoic chamber includes a receive assembly and a transmit assembly, each including a mast composed of a thermoplastic, a motor, a microcontroller, a height sensor configured to measure a height, and an antenna all coupled to the mast. The antenna includes a measurement point, and the transmit assembly and receive assembly are each configured to autonomously relocate within the semi-anechoic chamber and to autonomously move the antenna vertically with respect to the mast. The transmit assembly includes a positioning sensor configured to determine a location of the transmit assembly relative to one of a landmark and the semi-anechoic chamber. The microcontroller of the transmit assembly is configured to receive a validation arrangement from a local client, move the transmit assembly such that the transmit assembly is at the validation location and the measurement point of the transmit antenna is at a validation transmit height, and send an instruction to the microcontroller of the receive assembly, the instruction describing a validation distance, a polarity, and a validation receive height. The microcontroller of the receive assembly is communicatively coupled to the microcontroller of the transmit assembly and configured to receive the instruction from the microcontroller of the transmit assembly and move the antenna of the receive assembly such that the measurement point of the receive antenna is at the validation receive height and a separation between the measurement point of the transmit antenna and the measurement point of the receive antenna is restored to the validation distance.

Particular implementations may comprise one or more of the following features.

Each validation arrangement corresponds to a validation point, the validation point located within the semi-anechoic chamber at the measurement point of the transmit antenna after the validation arrangement has been implemented.

A test volume within the semi-anechoic chamber is validated using a plurality of validation measurements, the test volume being bound by a plurality of validation points corresponding to a plurality of validation arrangements that correspond to the plurality of validation measurements.

According to another aspect, a system for the automated validation of a semi-anechoic chamber includes a transmit assembly configured to autonomously relocate within the semi-anechoic chamber. A receive assembly is communicatively coupled to the transmit assembly and configured to autonomously relocate within the semi-anechoic chamber. A local client is communicatively coupled to the transmit assembly and configured to send a validation arrangement to the transmit assembly describing a validation location and a distance. The transmit assembly is configured to receive the validation arrangement, move the transmit assembly to the validation location and send an instruction to the receive assembly, the instruction describing the distance. The receive assembly is configured to receive the instruction and move the receive assembly such that a separation between the transmit and receive assemblies is restored to the distance.

Particular implementations may comprise one or more of the following features.

Each validation arrangement corresponds to a validation point.

A plurality of validation points defines a test volume.

According to still another aspect, a system for the automated validation of a semi-anechoic chamber includes. A receive assembly and a transmit assembly, each including a mast composed of a thermoplastic. The system also includes a motor, a microcontroller, a height sensor configured to measure a height, and an antenna mount all coupled to the mast. The antenna mount is configured to releasably couple to an antenna through an antenna adapter. The antenna includes a measurement point. The transmit assembly and receive assembly are each configured to autonomously relocate within the semi-anechoic chamber and to autonomously move the antenna mount vertically with respect to the mast. The system also includes a range finder coupled to one of the receive assembly and the transmit assembly, the range finder configured to determine a measured separation between the range finder and the other of the receive assembly and the transmit assembly. The system includes a plurality of antenna adapters, each antenna adapter sized and shaped to couple to a different antenna from a plurality of antennas such that, for either the receive assembly and the transmit assembly, the measurement point of every antenna of the plurality of antennas is located at the same point relative to the antenna mount when the associated antenna adapter is releasably coupled to the antenna mount. The system also includes a local client communicatively coupled to the microcontroller of the transmit assembly, a transmit antenna releasably coupled to the antenna mount of the transmit assembly, and a receive antenna releasably coupled to the receive assembly. The local client includes a measurement system and is configured to send a validation arrangement to the microcontroller of the transmit assembly, the validation arrangement describing a validation location within the semi-anechoic chamber, a validation transmit height, a validation receive height, a polarity, and a validation distance. The local client is also configured to instruct the measurement system to obtain a validation measurement corresponding to the validation arrangement. The measurement system is configured to send a validation input to the transmit antenna and receive a validation output from the receive antenna in response to the validation input sent to the transmit antenna. The validation measurement is based at least in part on a difference between the validation input and the validation output. The transmit assembly further includes a positioning sensor configured to determine a location of the transmit assembly relative to one of a landmark and the semi-anechoic chamber. The microcontroller of the transmit assembly is configured to receive the validation arrangement from the local client, and move the transmit assembly within the semi-anechoic chamber, guided by the positioning sensor, such that the transmit assembly is at the validation location. The microcontroller of the transmit assembly is also configured to move the antenna mount of the transmit assembly, guided by the height measured by the height sensor of the transmit assembly, such that the measurement point of the transmit antenna is at the validation transmit height, and such that the transmit antenna assumes the polarity of the validation arrangement, with respect to the transmit assembly. The microcontroller of the transmit assembly is configured to orient the transmit assembly within the semi-anechoic chamber such that the transmit antenna is pointed at the receive antenna, and to send an instruction to the microcontroller of the receive assembly, the instruction describing the validation distance, the polarity, and the validation receive height. The microcontroller of the receive assembly is communicatively coupled to the microcontroller of the transmit assembly and configured to receive the instruction from the microcontroller of the transmit assembly, and move the antenna mount of the receive assembly, guided by the height measured by the height sensor of the receive assembly, such that the measurement point of the receive antenna is at the validation receive height. The microcontroller of the receive assembly is also configured to move the receive assembly such that a separation between the measurement point of the transmit antenna and the measurement point of the receive antenna, as determined using the range finder, is restored to the validation distance. The microcontroller of the receive assembly is configured to move the antenna mount of the receive assembly such that the receive antenna is pointed at the transmit antenna, and such that the receive antenna assumes the polarity of the transmit antenna. Each validation arrangement corresponds to a validation point. The validation point is located within the semi-anechoic chamber at the measurement point of the transmit antenna after the validation arrangement has been implemented. A test volume within the semi-anechoic chamber is validated using a plurality of validation measurements. The test volume is bound by a plurality of validation points corresponding to a plurality of validation arrangements that correspond to the plurality of validation measurements. The local client includes a visual interface through which the plurality of validation measurements are output. The transmit assembly is configured to autonomously relocate within the semi-anechoic chamber through movement in two dimensions. The receive assembly is configured to autonomously relocate within the semi-anechoic chamber through movement confined to one dimension.

Particular implementations may comprise one or more of the following features. The system may further include a remote client communicatively coupled to the local client through a network. The local client may be further configured to receive the plurality of validation arrangements from the remote client. The plurality of validation arrangements may be selected by a certified user through the remote client. The local client may be configured to send the resulting plurality of validation measurements to the remote client, bypassing the visual interface of the local client. The test volume may be validated by the certified user using the plurality of validation measurements received through the remote client. Output of the plurality of validation measurements through the visual interface of the local client may be prevented until the plurality of validation measurements have been reviewed by the certified user through the remote client and the test volume has been validated. The transmit assembly may include a plurality of mechanum wheels. The microcontroller of the transmit assembly may be communicatively coupled to the microcontroller of the receive assembly through one of a fiber optic link and a wireless link. The positioning sensor may be an optical line reader configured to follow a path within the semi-anechoic chamber.

According to yet another aspect of the disclosure, a system for the automated validation of a semi-anechoic chamber includes a receive assembly and a transmit assembly, each including a mast, a motor, a microcontroller, a height sensor configured to measure a height, and an antenna mount, all coupled to the mast. The antenna mount is configured to releasably couple to an antenna including a measurement point. The transmit assembly and receive assembly are each configured to autonomously relocate within the semi-anechoic chamber and to autonomously move the antenna mount vertically with respect to the mast. The system also includes a range finder coupled to one of the receive assembly and the transmit assembly, the range finder configured to determine a measured separation between the range finder and the other of the receive assembly and the transmit assembly. The system includes a local client communicatively coupled to the microcontroller of the transmit assembly. The local client is configured to send a validation arrangement to the microcontroller of the transmit assembly, the validation arrangement describing a validation location within the semi-anechoic chamber, a validation transmit height, a validation receive height, and a validation distance. The local client is also configured to instruct a measurement system to obtain a validation measurement corresponding to the validation arrangement. The measurement system is communicatively coupled to a transmit antenna and a receive antenna. The transmit antenna is releasably coupled to the antenna mount of the transmit assembly. The receive antenna is releasably coupled to the antenna mount of the receive assembly. The measurement system is configured to send a validation input to the transmit antenna and receive a validation output from the receive antenna in response to the validation input sent to the transmit antenna. The validation measurement is based at least in part on a difference between the validation input and the validation output. The transmit assembly further includes a positioning sensor configured to determine a location of the transmit assembly relative to one of a landmark and the semi-anechoic chamber. The microcontroller of the transmit assembly is configured to receive the validation arrangement from the local client, and move the transmit assembly within the semi-anechoic chamber, guided by the positioning sensor, such that the transmit assembly is at the validation location. The microcontroller of the transmit assembly is also configured to move the antenna mount of the transmit assembly, guided by the height measured by the height sensor of the transmit assembly, such that the measurement point of the transmit antenna is at the validation transmit height. The microcontroller of the transmit assembly is configured to orient the transmit assembly within the semi-anechoic chamber such that the transmit antenna is pointed at the receive antenna, and send an instruction to the microcontroller of the receive assembly, the instruction describing the validation distance and the validation receive height. The microcontroller of the receive assembly is communicatively coupled to the microcontroller of the transmit assembly and configured to receive the instruction from the microcontroller of the transmit assembly, and move the antenna mount of the receive assembly, guided by the height measured by the height sensor of the receive assembly, such that the measurement point of the receive antenna is at the validation receive height. The microcontroller of the receive assembly is further configured to move the receive assembly such that a separation between the measurement point of the transmit antenna and the measurement point of the receive antenna, as determined using the range finder, is restored to the validation distance. Each validation arrangement corresponds to a validation point, the validation point located within the semi-anechoic chamber at the measurement point of the transmit antenna after the validation arrangement has been implemented. A test volume within the semi-anechoic chamber is validated using a plurality of validation measurements, the test volume being bound by a plurality of validation points corresponding to a plurality of validation arrangements that correspond to the plurality of validation measurements.

Particular implementations may comprise one or more of the following features. The microcontroller of the receive assembly may be further configured to move the antenna mount of the receive assembly such that the receive antenna may be pointed at the transmit antenna. The validation arrangement may further describe a polarity. The microcontroller of the transmit assembly may be further configured to move the antenna mount of the transmit assembly such that the transmit antenna assumes the polarity of the validation arrangement, with respect to the transmit assembly. The instruction sent to the microcontroller of the receive assembly may further describe the polarity. The microcontroller of the receive assembly may be further configured to move the antenna mount of the receive assembly such that the receive antenna assumes the polarity of the transmit antenna. Each antenna mount may be configured to receive an antenna adapter. The system may further include a plurality of antenna adapters. Each antenna adapter may be sized and shaped to couple to a different antenna from a plurality of antennas such that the measurement point of every antenna may be located at the same point relative to the antenna mount when the associated antenna adapter may be releasably coupled to the antenna mount. The local client may include the measurement system. The local client may include a visual interface through which the plurality of validation measurements are output. The system may further include a remote client communicatively coupled to the local client through a network. The local client may be further configured to receive the plurality of validation arrangements from the remote client. The plurality of validation arrangements may have been selected by a certified user through the remote client. The local client may also be configured to send the resulting plurality of validation measurements to the remote client, bypassing the visual interface of the local client. The test volume may be validated by the certified user using the plurality of validation measurements received through the remote client. The output of the plurality of validation measurements through the visual interface of the local client may be prevented until the plurality of validation measurements have been reviewed by the certified user through the remote client and the test volume has been validated. The transmit assembly may be configured to autonomously relocate within the semi-anechoic chamber through movement in two dimensions. The receive assembly may be configured to autonomously relocate within the semi-anechoic chamber through movement confined to one dimension. The transmit assembly may include a plurality of mechanum wheels. The microcontroller of the transmit assembly may be communicatively coupled to the microcontroller of the receive assembly through one of a fiber optic link and a wireless link. The mast of the transmit assembly and/or the mast of the receive assembly may both be composed of a thermoplastic. The mast of the transmit assembly and/or the mast of the receive assembly may be RF transparent up to 40 GHz. The motor of the transmit assembly and/or the motor of the receive assembly may be pneumatic motors including a thermoplastic. The positioning sensor may be an optical line reader configured to follow a path within the semi-anechoic chamber.

According to even another aspect of the disclosure, a system for the automated validation of a semi-anechoic chamber includes a receive assembly and a transmit assembly, each including a mast, a motor, a microcontroller, a height sensor configured to measure a height, and an antenna mount all coupled to the mast. The antenna mount is configured to releasably couple to an antenna including a measurement point, the transmit assembly and receive assembly each configured to autonomously relocate within the semi-anechoic chamber and to autonomously move the antenna mount vertically with respect to the mast. The system also includes a local client communicatively coupled to the microcontroller of the transmit assembly. The local client is configured to send a validation arrangement to the microcontroller of the transmit assembly, the validation arrangement defining a validation location within the semi-anechoic chamber, a validation transmit height, a validation receive height, and a validation distance. The local client is also configured to instruct a measurement system to obtain a validation measurement corresponding to the validation arrangement. The measurement system is communicatively coupled to a transmit antenna and a receive antenna. The transmit antenna is releasably coupled to the antenna mount of the transmit assembly. The receive antenna is releasably coupled to the antenna mount of the receive assembly. The transmit assembly further includes a positioning sensor configured to determine a location of the transmit assembly. The microcontroller of the transmit assembly is configured to receive the validation arrangement from the local client, and move the transmit assembly such that the transmit assembly is at the validation location and the measurement point of the transmit antenna is at the validation transmit height. The microcontrolle of the transit assembly is also configured to send an instruction to the microcontroller of the receive assembly, the instruction describing the validation distance and the validation receive height. The microcontroller of the receive assembly is communicatively coupled to the microcontroller of the transmit assembly and configured to receive the instruction from the microcontroller of the transmit assembly, and move the receive assembly such that the measurement point of the receive antenna is at the validation receive height and a separation between the measurement point of the transmit antenna and the measurement point of the receive antenna is restored to the validation distance as determined by a range finder coupled to one of the receive assembly and the transmit assembly. Each validation arrangement corresponds to a validation point, the validation point located within the semi-anechoic chamber at the measurement point of the transmit antenna after the validation arrangement has been implemented. A test volume within the semi-anechoic chamber is validated using a plurality of validation measurements, the test volume being bound by a plurality of validation points corresponding to a plurality of validation arrangements that correspond to the plurality of validation measurements.

Particular implementations may comprise one or more of the following features. The system may further include a remote client communicatively coupled to the local client through a network. The local client may be further configured to receive the plurality of validation arrangements from the remote client. The plurality of validation arrangements may have been selected by a certified user through the remote client. The local client may also be configured to send the resulting plurality of validation measurements to the remote client, bypassing a visual interface of the local client. The test volume may be validated by the certified user using the plurality of validation measurements received through the remote client.

Unless specifically noted, it is intended that the words and phrases in the specification and the claims be given their plain, ordinary, and accustomed meaning to those of ordinary skill in the applicable arts. The inventor is fully aware that he can be his own lexicographer if desired. The inventor expressly elects, as his own lexicographer, to use only the plain and ordinary meaning of terms in the specification and claims unless he clearly states otherwise and then further, expressly sets forth the "special" definition of that term and explains how it differs from the plain and ordinary meaning. Absent such clear statements of intent to apply a "special" definition, it is the inventor's intent and desire that the simple, plain and ordinary meaning to the terms be applied to the interpretation of the specification and claims.

The inventor is also aware of the normal precepts of English grammar. Thus, if a noun, term, or phrase is intended to be further characterized, specified, or narrowed in some way, then such noun, term, or phrase will expressly include additional adjectives, descriptive terms, or other modifiers in accordance with the normal precepts of English grammar. Absent the use of such adjectives, descriptive terms, or modifiers, it is the intent that such nouns, terms, or phrases be given their plain, and ordinary English meaning to those skilled in the applicable arts as set forth above.

Further, the inventor is fully informed of the standards and application of the special provisions of 35 U.S.C. § 112(f). Thus, the use of the words "function," "means" or "step" in the Detailed Description or Description of the Drawings or claims is not intended to somehow indicate a desire to invoke the special provisions of 35 U.S.C. § 112(f), to define the invention. To the contrary, if the provisions of 35 U.S.C. § 112(f) are sought to be invoked to define the inventions, the claims will specifically and expressly state the exact phrases "means for" or "step for", and will also recite the word "function" (i.e., will state "means for performing the function of [insert function]"), without also reciting in such phrases any structure, material or act in support of the function. Thus, even when the claims recite a "means for performing the function of . . . " or "step for performing the function of . . . ," if the claims also recite any structure, material or acts in support of that means or step, or that perform the recited function, then it is the clear intention of the inventor not to invoke the provisions of 35 U.S.C. § 112(f). Moreover, even if the provisions of 35 U.S.C. § 112(f) are invoked to define the claimed aspects, it is intended that these aspects not be limited only to the specific structure, material or acts that are described in the preferred implementations, but in addition, include any and all structures, materials or acts that perform the claimed function as described in alternative implementations or forms of the disclosure, or that are well known present or later-developed, equivalent structures, material or acts for performing the claimed function.

DRAWINGS

The disclosure will hereinafter be described in conjunction with the appended drawings, where like designations denote like elements, and:

FIG. 1 is a perspective view of an automated validation system deployed within a semi-anechoic chamber;

FIGS. 2A, 2B, and 2C are front, side, and top views of a transmit assembly, respectively;

FIGS. 5A-5E are schematic top views of an automated validation system at different stages of the automated validation process.

DESCRIPTION

Figure 1:
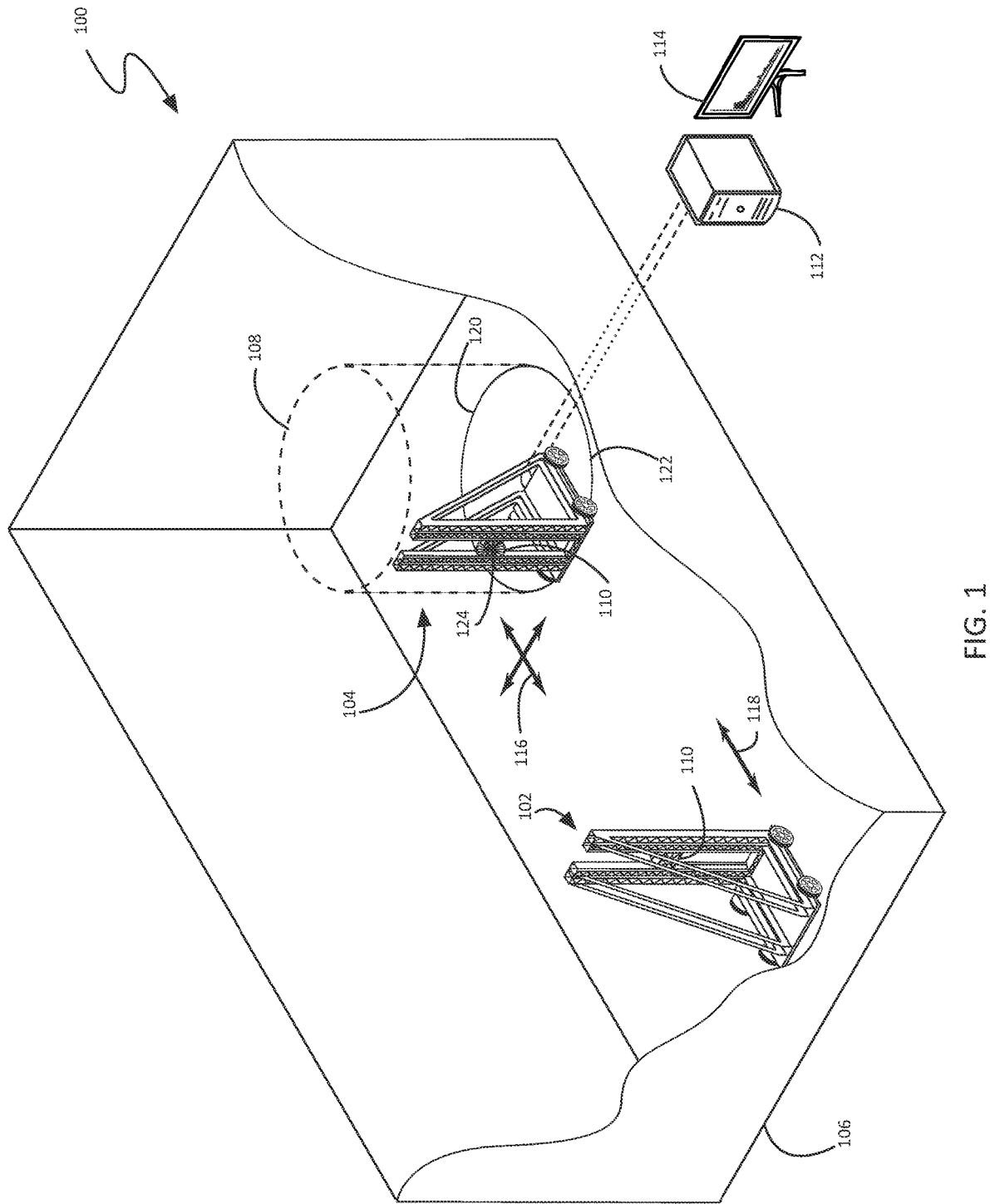

This disclosure, its aspects and implementations, are not limited to the specific material types, or other system component examples, or methods disclosed herein. Many additional components, manufacturing and assembly procedures known in the art are contemplated for use with particular implementations from this disclosure consistent with their operation and manufacture. Accordingly, for example, although particular implementations are disclosed, such implementations and implementing components may comprise any components, models, types, materials, versions, quantities, and/or the like as is known in the art for such systems and implementing components, consistent with the intended operation.

The word "exemplary," "example," or various forms thereof are used herein to mean serving as an example, instance, or illustration. Any aspect or design described herein as "exemplary" or as an "example" is not necessarily to be construed as preferred or advantageous over other aspects or designs. Furthermore, examples are provided solely for purposes of clarity and understanding and are not meant to limit or restrict the disclosed subject matter or relevant portions of this disclosure in any manner. It is to be appreciated that a myriad of additional or alternate examples of varying scope could have been presented, but have been omitted for purposes of brevity.

While this disclosure includes a number of implementations in different forms, there is shown in the drawings and will herein be described in detail, particular implementations. As such, the disclosure is presented with the understanding that the disclosure is to be considered as an exemplification of the principles of the disclosed structures, methods, and systems, and is not intended to limit the broad aspect of the disclosed concepts to the implementations illustrated.

Contemplated herein is a system for the automated validation of a semi-anechoic chamber that can validate a semi-anechoic chamber with greater accuracy, in less time, and at lower cost. The contemplated system for the automated validation of a SAC (hereinafter "automated validation system" or "AVS") makes use of transmit and receive assemblies (e.g., moveable masts) that are capable of autonomous movement within the SAC. This is accomplished, in part, by maintaining a non-metallic or wireless communication link between the transmit assembly and receive assembly. According to various implementations, the transmit assembly is able to move to a specific location (i.e., a point within the quiet zone) and then automatically communicate with the receive assembly, guiding it to maintain a specific separation from measurement to measurement. The assemblies are able to adjust themselves to achieve the proper angular, height, polarity, and distance relationships required for the validation testing.

The contemplated automated validation system is able to validate a SAC with little to no human intervention. Conventional methods require a technician to enter the chamber, move the transmit mast, then move the receive mast, measure their separation and adjust to maintain their separation distance, exit and seal the chamber, and take a reading for each measurement point. In contrast, the contemplated system is much faster. According to various implementations, once the test area has been set up (e.g., transmit and receive assemblies placed inside SAC and positioned at starting locations, antennas changed, etc.), the validation can proceed autonomously, accomplishing in a matter of seconds steps that would take five minutes or more using traditional methods. Since the SAC does not need to be opened until an antenna needs to be changed, and since the various measurements are performed almost instantly, the time needed to perform the validation is essentially the time needed for the assemblies to move from position to position. Even moving slowly, it might only take 10-15 seconds for the assemblies to move and orient, a fraction of the time needed for traditional methods.

The AVS is able to validate a SAC at less expense to the chamber owner. Conventional methods can require a chamber to be taken down for days, time during which this expensive test site is not earning money. In contrast, the AVS only requires a matter of minutes to perform the needed measurements, and because it operates autonomously, it can perform its measurements while the technical staff is otherwise occupied and unavailable to operate the SAC anyways (e.g., during staff meetings, outside of business hours, etc.).

Another cost benefit provided by the AVS is that it may be operated remotely in some implementations. Validation of a SAC so it may be used for certifying devices for regulatory purposes must be performed by a certified technician affiliated with an accredited agency. In many cases, a large part of the expense of validation stems from the cost of travel and housing for the required certified technicians for however many days are needed. According to various implementations, the AVS may be controlled remotely by a certified technician, who can input the test parameters and evaluate the results in accordance with regulation without having to go anywhere. As a specific example, in some implementations, an automated validation system can simply be rented and sent to the site of a SAC. After it is set up by site technicians, it is operated remotely by accredited staff. All this may be done without the expensive travel and time needed by conventional methods.

Typically, a SAC must only be validated once a year. While this can satisfy regulatory requirements, it can create a risk for the SAC owner, a risk that many commercial labs take due to the cost of conventional validation methodologies. For example, take a test chamber that is validated on January 1 and then used all year to certify devices. When that SAC is characterized again the next year, as required, it might not pass (e.g., a piece of absorber fell off the wall and was not noticed, a door seal has failed, etc.). In such a situation, every test performed with that SAC since its last successful validation is now called into question. Customers have to be contacted, and deficiency reports must be filed. Validating only once a year creates the risk of undoing as much as a year of business.

Advantageously, the AVS is fast enough and cheap enough that validation (official or unofficial) may be performed much more frequently (e.g., weekly). For example, an automated validation may be started at the end of the week, working autonomously while the staff heads home for the weekend. Frequent testing is an effective risk mitigation strategy, only risking the work done since the last characterization (e.g., one week, etc.).

Another advantage the contemplated automated validation system has over conventional methods is that it produces results that are more accurate and reproducible. Conventional methods rely on a technician performing distance measurements (e.g., separation between masts, linear adjustments to sample standing wave, etc.) using measuring tapes or similar tools provide numerous opportunities for the introduction of error. Returning to a previous example, a validation of a SAC sampling 5 locations within the quiet zone at two heights, two polarities, and 6 linear advancements at each location would require the technician to perform at least 120 distance measurements. Additionally, the movement of the masts is performed by the technician manually moving the masts at least 120 times. Advantageously, the contemplated AVS performs that validation using robotic movement and automatic measurement devices (e.g., laser range finder, etc.), providing a much greater degree of accuracy and repeatability.

The enhanced accuracy and repeatability of the contemplated AVS becomes even more important when dealing with signals of higher frequency. According to various implementations, the AVS contemplated herein is configured for operation with frequencies 18-40 GHz. While currently there are no regulatory standards for this range, it is only a matter of time before SACs will have to be validated beyond 18 GHz. One problem with these higher frequencies is the number of linear advancements needed to probe a standing wave increases while the distances shrink. As a specific example, a validation at 40 GHz could involve movements as small as 1-2 mm, having to be performed 33-40 times, rather than the 6 times done at 18 GHz. This means validation at 40 GHz could require 600-700 distance measurements and movements as small as 1-2 mm. While this would be a staggering undertaking if done using conventional methods, the contemplated AVS can perform the validation in a matter of minutes, with the same superior accuracy exhibited by the AVS at lower frequencies.

Another advantage of the automated validation system over conventional methods and systems is that, in some implementations, the elements of the AVS inside the SAC are essentially RF transparent up to 40 GHz. This is accomplished through material choice combined with structural design (e.g., no pieces larger than 0.5 mm, the use of air gaps, etc.), according to various implementations.

According to various implementations, the contemplated AVS can be used to validate or otherwise characterize a semi-anechoic chamber or similar test site (e.g., fully- and partially-covered open air test sites, fully anechoic rooms (FAR), etc.), following a methodology required by regulation. It should be noted that while much of the following discussion is done in the context of validating a SAC using a specific methodology, such as IEEE C63.25.1, the systems and methods contemplated herein may be adapted for use with other types of testing sites using other methodologies.

FIG. 1 is a perspective view of a non-limiting example of an automated validation system 100 deployed within a semi-anechoic chamber 106. As shown, the AVS 100 comprises a receive assembly 102, a transmit assembly 104, and a local client 112 communicatively coupled to the transmit assembly 104. It should be noted that part of the SAC 106 has been cut away and various elements common to semi-anechoic chambers, such as a door and shaped foam absorbers, have been omitted for clarity. These omissions should not be interpreted as limitations; those skilled in the art will recognize that the AVS 100 contemplated herein may be adapted for use with any semi-anechoic chamber or similar testing location.

The automated validation system 100 comprises two assemblies, a transmit assembly 104 and a receive assembly 102. In the context of the present description and the claims that follow, an assembly is an autonomous, mobile structure to which an antenna 110 is attached. These assemblies, together, perform the procedures specified by regulation and conventionally performed manually by a technician and a mast. The specific structures and functionalities of these assemblies will be discussed in greater detail with respect to FIGS. 2A-2C, below.

The receive antenna 408 and the transmit assembly 104 are able to move autonomously within the SAC 106, positioning themselves at various locations as part of the validation process. In some implementations, the receive assembly 102 and the transmit assembly 104 may be identical. In other implementations, these assemblies may differ in structure and/or functionality. For example, in some implementations, the transmit assembly 104 is configured to autonomously relocate within the semi-anechoic chamber 106 through movement in two dimensions 116, while the receive assembly 102 is configured to autonomously relocate within the semi-anechoic chamber 106 through movement confined or limited to one dimension 118.

In the context of the present description and the claims that follow, a device being autonomous or being able to do something autonomously means that the device (e.g., transmit assembly 104, receive assembly 102, etc.) is capable of performing said action or accomplishing said task with little to no human interaction. It should be noted that the term autonomous, in the context of the present description and the claims that follow, does not require the complete absence of human assistance or instruction. A device performing a task autonomously may mean that it accomplishes the task upon receipt of instructions from a human or another device. As a specific example, the AVS can autonomously validate a SAC 106 after an accredited technician has instructed the system 100 which locations to capture, at what assembly separation, and so forth. The term autonomous should not be interpreted to require the device to possess intelligence, though in some implementations the AVS 100 contemplated herein may comprise machine learning, machine vision, artificial intelligence, and the like, enabling the system 100 to accomplish some or all of the tasks contemplated herein or otherwise known in the art. As a specific example, in one implementation, the automated validation system 100 may be configured to map out the quiet zone within the SAC 106 that meets a particular criteria by using artificial intelligence to guide the transmit assembly 104 as it wanders about the SAC 106.

According to various implementations, the transmit assembly 104 is able to move autonomously to various positions to establish readings for a test volume 108, sometimes called a "quiet zone". The test volume 108 is the volume within the SAC 106 that is being validated, according to various implementations. It is defined through, and bound by, a plurality of validation points 124. As previously discussed, the validation involves sending a signal from the transmit assembly 104 and receiving it at the receive assembly 102, and comparing the signal strength for different locations, heights, and polarities within the SAC 106. In the context of the present description and the claims that follow, a validation point 124 is the precise location within the semi-anechoic chamber 106 that the signal is deemed to originate from when emitted by the antenna 110 of the transmit assembly 104. This point is also known as the measurement point of the antenna 110, which will be discussed further with respect to FIG. 3, below.

Each validation point 124 is associated with a validation arrangement, which is a specific configuration of at least the transmit assembly 104 (e.g., location within the semi-anechoic chamber 106, height, polarity, etc.). Validation arrangements, and the resulting validation measurements, will be discussed further with respect to FIGS. 4A and 4B, below.

The test volume 108 is defined by the locations of the validation points 124 within the semi-anechoic chamber 106. The transmit assembly 104 moves about the SAC 106 to position its antenna 110 to emit at those desired validation points 124. According to various implementations, the transmit assembly 104 is able to move in two dimensions 116 across the floor of the semi-anechoic chamber 106. In some implementations, the receive assembly 102 can also move in two dimensions. In other implementations, the receive assembly 102 can only move in one dimension 118, translating back and forth along a line.

According to various implementations, the receive assembly 102 does not need to be capable of complicated maneuvering or require any sort of intelligence. Instead, the receive assembly 102 simply moves back and forth in order to maintain a certain separation from the transmit assembly 104. More specifically, to maintain a separation between the measurement points of the transmit and receive antennas 110.

In order to capture the validation points 124 required by regulation, the transmit assembly 104 needs to be able to navigate the interior of the SAC 106. In some implementations, the transmit assembly 104 is able to determine the location of the transmit assembly 104 relative to the semi-anechoic chamber 106 (e.g., distance from various walls within the SAC 106, etc.). In other implementations, the transmit assembly 104 is able to determine the location of the transmit assembly 104 relative to a landmark 122.

In the context of the present description and the claims that follow, a landmark 122 is something within the SAC 106 that is unique; being able to determine the location of the transmit assembly 104 relative to said landmark 122, and observing changes in that relative position, allows the transmit assembly 104 to navigate a path between positions associated with validation points 124, even if it does not know where it is inside the SAC 106. In some implementations, this approach may require a human to manually place the transmit assembly 104 in the desired starting location, with all subsequent locations being located relative to the landmark 122. Examples of landmark 122 include, but are not limited to, objects (e.g., the turntable 120, etc.), boundaries (e.g., the edge of the turntable 120, etc.), markings (e.g., paths, etc.), light(s), and the like.

In some implementations, the transmit assembly 104 may determine its location relative to a pattern. For example, in some implementations the transmit assembly 104 may be configured to determine its location by observing a pattern that has been applied to the floor or other surface within the SAC 106 (e.g., capturing a part of the pattern with a camera, etc.). This pattern may be a positional coding pattern, like the Anoto dot pattern or other patterns used in digital paper, which make it possible to determine a location relative to said pattern as a whole simply by observing a small part of the pattern.

As shown, the transmit assembly 104 is communicatively coupled to a local client 112 through fiber optics or some other means known in the art (e.g., linked through channel beneath ground plane of SAC 106, wireless connection, etc.) that would not affect the measurements being performed inside the SAC 106. In the context of the present description and the claims that follow, a local client 112 is a computing device that is located outside the SAC 106 (e.g., beside, beneath, etc.), and that is able to provide instructions to the transmit assembly 104, such as validation arrangements. In some implementations, the local client 112 is also able to send signals to be emitted by the antenna 110 of the transmit assembly 104, while in other implementations, the local client 112 is configured to instruct another device (e.g., conventional signal generator, etc.) to send said signals. The local client 112 will be discussed further with respect to FIGS. 4A and 4B, below.

In some implementations, the local client 112 comprises, or is communicatively coupled to, a visual interface 114 through which the validation measurements are output. In some implementations, this may be a hardware interface (e.g., a monitor). In other implementations, the visual interface 114 may be software based (e.g., a GUI, a report generated as a document, etc.). In some implementations configured to allow remote operation by certified validation technicians from an accredited agency, the visual interface 114 may be disabled until the validation is complete, so the people local to the SAC 106 being validated cannot see the data being obtained. This would make it more difficult for them to influence the results and game the system by nudging something to get the desired outcome.

Figure 2C:
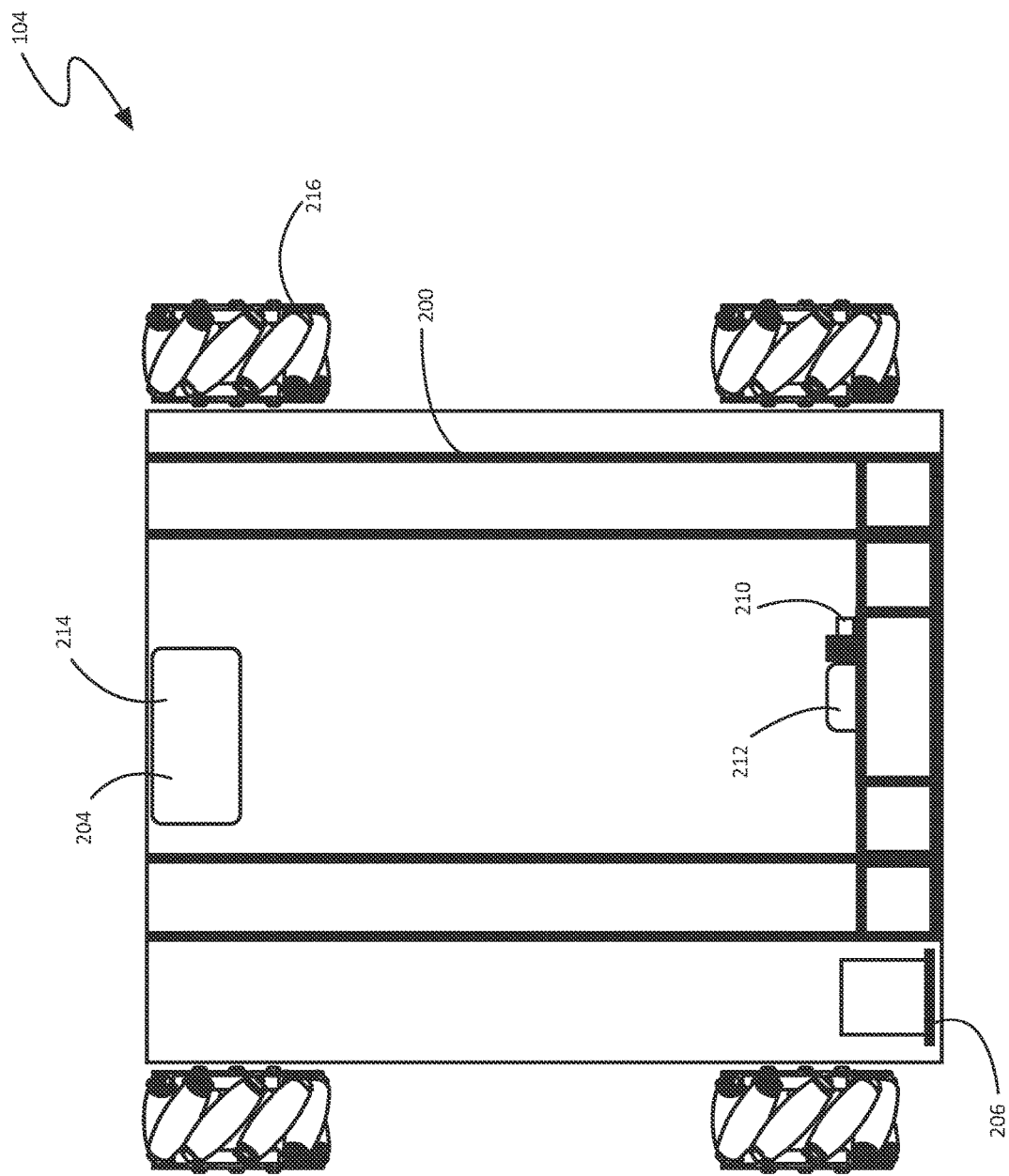

FIGS. 2A, 2B, and 2C are front, side, and top views of a non-limiting example of a transmit assembly 104, respectively. As previously stated, in some implementations, the receive assembly 102 may be identical to the transmit assembly 104. Because the receive assembly 102 does not need to possess as much functionality as the transmit assembly 104, in other implementations the two assemblies may be different. While the following discussion is done in the context of a transmit assembly 104, all of what is being discussed could apply to the receive assembly 102 as well. Implementations of the receive assembly 102 that differ from the transmit assembly 104 will also be discussed.

As shown, the transmit assembly 104 comprises a mast 200, an antenna mount 202, a motor 204, and a height sensor 210. The antenna mount 202 and the height sensor 210 are coupled to the mast 200. All of these elements are also present in the receive assembly 102. The transmit assembly 104 also comprises a positioning sensor 212 that is not strictly required by the receive assembly 102 and may thus be omitted from the receive assembly 102 in some implementations. Additionally, at least one of the transmit assembly 104 and the receive assembly 102 further comprise a range finder 206 to measure the separation between the two assemblies (thus, only one assembly needs a range finder 206). The non-limiting example of a transmit assembly 104 shown in FIGS. 2A-2C also has the range finder 206, but in other implementations the range finder 206 may be located on the receive assembly 102, or on both assemblies (e.g., when the assemblies are identical, etc.). Not shown are additional elements such as a microcontroller and gearing for the motor 204.

Each assembly includes a mast 200. Those skilled in the art may wish to refer to the transmit assembly 104 and receive assembly 102 as masts. However, it is important to note that the assemblies are more accurately described as masts (in the traditional use of the word within the art) that are mounted on platforms that can move themselves, alongside various sensors. The mast 200 is simply the structure that holds the antenna 110 at a desired height, and on which various sensors are mounted. In order to minimize reflections within the SAC 106 that would interfere with an accurate assessment of the chamber's performance, the mast 200 (the largest part of the transmit assembly 104) uses minimal metal and is constructed to have a low dielectric constant.

Traditional transmit/receive masts are usually tripods made of wood (or similar material). Some implementations of the contemplated AVS 100 may use similar materials. However, other implementations, particularly implementations configured for use at frequencies between 18 GHz and 40 GHz, use other materials and geometries designed to further maximize permittivity of radio frequencies. While wood and fiberglass are used in traditional masts employed at frequencies up to 18 GHz, even wood becomes highly reflective at higher frequencies. According to various implementations, the assemblies contemplated herein are RF transparent or substantially transparent up to 40 GHz, a feat further complicated by the inclusion of the hardware needed to make the assemblies mobile and autonomous.

In the context of the present description and the claims that follow, an assembly is RF transparent in a frequency range when it does not influence the signals observed within the semi-anechoic chamber in the course of a validation to meet regulatory standards. In some implementations, the assemblies contemplated herein are substantially RF transparent up to 40 GHz. In the context of the present description and the claims that follow, an assembly is substantially RF transparent when it is at least 98% transparent to RF signals up to 40 GHz.

According to various implementations, the transmit assembly 104 and receive assembly 102 are RF transparent or substantially RF transparent, even at frequencies as high as 40 GHz, due in large part to material used. The closer the overall dielectric constant of the assembly gets to 1 (the dielectric constant of air), the better. Plywood has a dielectric constant of at least 9, while fiberglass is about 4. Both of these materials are too dense to be of use at the higher frequencies. In some implementations, the transmit assembly 104 and receive assembly 102, including but not limited to the masts 200, are composed of a thermoplastic polymer 208, such as polycarbonate. Polycarbonate has a dielectric constant slightly less than 2.

In addition to the materials used, the transmit assembly 104 and receive assembly 102 are RF transparent also due to their design. The use of a thermoplastic 208 opens up designs that would be difficult, impractical, or even impossible using traditional mast materials such as fiberglass or wood. According to various implementations, thermoplastics 208 such as polycarbonate are easy to cut or machine, making it possible to create designs that have low density and mass, but that take up a lot of volume. For example, in some implementations, including the non-limiting examples shown in FIGS. 2A-2C, the mast 200 may be made up of many air gaps, through which most of the waves will pass. In some implementations, none of the pieces making up the mast 200 are bigger than 0.5 mm. When the larger pieces are smaller than a quarter wavelength of the highest frequency being measured, the mast 200 is effectively transparent. Other considerations include orienting the various components of the mast 200 such that where they have the highest density (i.e., on the sides), it is in the plane of measurement, and is still not very thick (e.g., roughly a quarter inch).

Each assembly has an antenna mount 202 configured to releasably couple to an antenna 110. According to various implementations, the antenna mount 202 is able to move up and down. The transmit assembly 104 and receive assembly 102 are each configured to autonomously move the antenna mount 202 vertically with respect to the mast 200 (e.g., sliding in a track, etc.), according to various implementations.

Validation typically requires that measurements be made in both horizontal and vertical polarities, essentially requiring the antenna 110 to be rotated between horizontal and vertical. In conventional validation methods and procedures, this was yet another opportunity to introduce error and reduce reproducibility. Technician A's "vertical" might not be as vertical as technician B's "vertical". Particularly in horizontal, being just a little bit off from true vertical or true horizontal can have a large impact on the subsequent measurements. Advantageously, the antenna mount 202 of the contemplated automated validation system 100 is able to move between the two polarities automatically, greatly increasing reproducibility as well as accuracy. As an option, in some implementations, the rotating of the antenna mount 202 to switch polarities may be driven by a pneumatic actuator. Using pneumatic actuators and/or motors is advantageous as they can be constructed from plastic and other materials less likely to create reflections than metal.

Unlike traditional masts, the assemblies contemplated herein have additional elements required for autonomous operation that can become problematic with respect to reflections and interference. As shown, in some implementations, these elements, such as a motor 204 and associated gearing, sensors, and other elements may be placed low on the assemblies, mounted towards the rear of the assemblies. These elements are also powered down for the validation measurements.

Validation may require measurements be taken at different heights. In traditional masts, the height may be adjusted using a pulley and a rope reeled in by a stepper motor. The height is measured by counting the rotations on the stepper motor. Rope is often used to minimize reflections; however, rope also stretches over time, which can lead to errors in measuring the height and problems with reproducibility.

According to various implementations, the transmit assembly 104 and receive assembly 102 each comprise a height sensor 210 configured to measure a height. In some implementations, the height measured is also the height of the measurement point of the antenna 110. In other implementations, the height measured may be different from the height of the measurement point, but only by a fixed amount. For example, as shown in FIG. 2A, in one implementation the height sensor 210 may be mounted below the antenna mount 202, measuring the distance to the bottom of the antenna mount 202 but also placing the height sensor 210 low and behind the antenna 110.

In some implementations, the height sensor 210 may be an optical height sensor, which can advantageously be placed near the rear of the assembly and output through a fiber optic filament aimed at, or coupled to, the antenna 110 or antenna mount 202. This allows for minimal conductive material within the test volume 108. Other implementations may use any other low-noise/high-precision method known in the art.

As previously mentioned, in some implementations, the transmit assembly 104 and the receive assembly 102 may be identical, while in other implementations they may be different in one or more ways. There are a few elements that are required by the transmit assembly 104, in some implementations, that are not needed in the receive assembly 102. For example, the transmit assembly 104 needs to be able to move in two dimensions 116, while the receive assembly 102 only needs to move in one. As another example, in some implementations, the receive assembly 102 can change the angle of its antenna mount 202 with respect to the rest of the receive assembly 102 such that it is pointed at the antenna 110 of the transmit assembly 104, while the transmit assembly 104 can reorient the entire assembly to aim the antenna 110 directly at the receive assembly 102. In other implementations, the transmit assembly 104 may also have the ability to reorient its antenna mount 202 with respect to the rest of the transmit assembly 104.

Using a simplified receive assembly 102 rather than a receive assembly 102 identical to the transmit assembly 104 may reduce the cost of manufacture. However, the use of identical assemblies introduces redundancy that is favored by many commercial laboratories. Labs will often purchase spare masts, so that a broken mast does not cause the SAC 106 to go idle while the mast is repaired or replaced, which can take weeks. Using identical assemblies here would mean a single assembly could be used as a backup or replacement for either the transmit assembly 104 or the receive assembly 102.

As previously mentioned, in some implementations, one of the receive assembly 102 and the transmit assembly 104 comprises a range finder 206. The range finder 206 is configured to determine the separation between the range finder 206 and the other assembly. This is used to maintain the separation between the transmit assembly 104 and the receive assembly 102 throughout the validation. In some implementations, the range finder 206 is an optical range finder. As an option, the range finder 206 may be configured to measure the distance to an optical target (i.e., a target whose surface facilitates the use of an optical range finder) on the other assembly.

In some implementations, the range finder 206 provides a continuously updating measurement, in real time. This stream of measurements may be used to continuously update and reposition the receive assembly 102 as the transmit assembly 104 moves into place. In such implementations, it may be advantageous for the range finder 206 to be located on the receive assembly 102, so it can react to changes in the separation as they happen, without having to wait for instructions from the transmit assembly 104 regarding a new position.

It should be noted that for frequencies treated under conventional validation methodologies (e.g., 1 GHz to 18 GHz), automatically maintaining the separation between the two assemblies provides greater accuracy in less time. However, the conventional methods could still be used. At higher frequencies, approaching 40 GHz, the contemplated automated validation system 100 may be the only practical method for performing the large number of measurements involving movements small enough to fall within the range of error in manual measurements.

As shown, the transmit assembly 104 comprises a positioning sensor 212. In the context of the present description and the claims that follow, a positioning sensor 212 is a device that allows the transmit assembly 104 to ascertain its relative location. In some implementations, the positioning sensor 212 determines the location of the transmit assembly 104 relative to at least part of the interior of the semi-anechoic chamber 106. As a specific example, in one implementation, the positioning sensor 212 may be a laser-based range finder configured to determine the distance between the positioning sensor 212 and at least two interior walls. As another specific example, in one implementation the positioning sensor 212 may be a plurality of sensors (e.g., cameras, optical range finders, etc.). The combined signals of this plurality of sensors are used to determine the location of the transmit assembly 104 within the SAC 106, relative to the SAC 106 itself, using simultaneous localization and mapping (SLAM). SLAM is a methodology developed for autonomous vehicles that allows them to navigate an unfamiliar environment. This may facilitate the deployment of the AVS 100 in a SAC 106 for the first time (e.g., a commercial lab has rented an AVS 100 to be operated remotely, etc.). This may also help determine the size and shape of a test volume 108 that meets a certain criteria, which may involve allowing the transmit assembly 104 to wander about the SAC 106.

In some implementations the positioning sensor 212 determines the location of the transmit assembly 104 relative to a landmark 122, as previously discussed. Exemplary positioning sensors 212 include, but are not limited to, a camera used in conjunction with a positional coding pattern or a collection of unique symbols or markers, a line reader used in conjunction with a path or the edge of the turntable 120, and the like. Those skilled in the art will recognize that other methods for determining a position may be adapted for use with the AVS 100.

Each assembly has at least one motor 204 to drive the motion of the assembly (e.g., relocation, adjusting height, adjusting polarity, etc.). In some implementations, the motor 204 may be a conventional electric motor which contains metal. According to various implementations, the motor 204 may be positioned as low on the assembly as possible, and as far away from the assembly's antenna 110 as possible (as well as off-axis from the antenna 110), to minimize reflections. In other implementations, the motor 204 may be a pneumatic motor 214, driven by pressurized air supplied through a hose. A pneumatic motor 214 is advantageous as it may be constructed out of a thermoplastic 208 or other material that is less likely to interact with the electric signals within the SAC 106.

According to various implementations, the assemblies comprise wheels to facilitate their movement inside the SAC 106. Because the transmit assembly 104 moves in two dimensions 116, it will require the ability to either change orientation or simply translate along more than one direction. For example, in one implementation, the wheels of the transmit assembly 104 may be mounted on axles that can pivot, allowing the transmit assembly 104 to steer itself. In another implementation, the transmit assembly 104 may change direction through a differential in rotation between wheels on opposite sides of the transmit assembly 104 (e.g., rotating at different speeds, rotating in different directions, etc.).

In some implementations, including the non-limiting example shown in FIGS. 2A-2C, the transmit assembly 104 may be configured to translate along two dimensions 116 using mechanum wheels 216. In the context of the present description and the claims that follow, a mechanum wheel 216 is an omnidirectional tireless wheel that is able to move in any direction. While mechanum wheels 216 provide a greater degree of freedom to move than traditional wheels, they sometimes experience slippage, which may preclude the use of wheel rotations to determine the relative location of the transmit assembly 104 (i.e., relative to the previous position of the transmit assembly 104). However, in implementations where the positioning sensor 212 is based on a determination based on a static condition external to the transmit assembly 104 (e.g., topology of the inside of the SAC 106, one or more landmarks 122, etc.), the use of a plurality of mechanum wheels 216 may be advantageous.

It should be noted that some of the elements shown in FIGS. 2A-2C are not drawn to scale, to make them more visible. According to various implementations, the wheels used on the assemblies are small, allowing the assembly to be as close as possible to the floor of the SAC 106 (i.e., the ground plane), which helps minimize the reflections.

Figure 3:
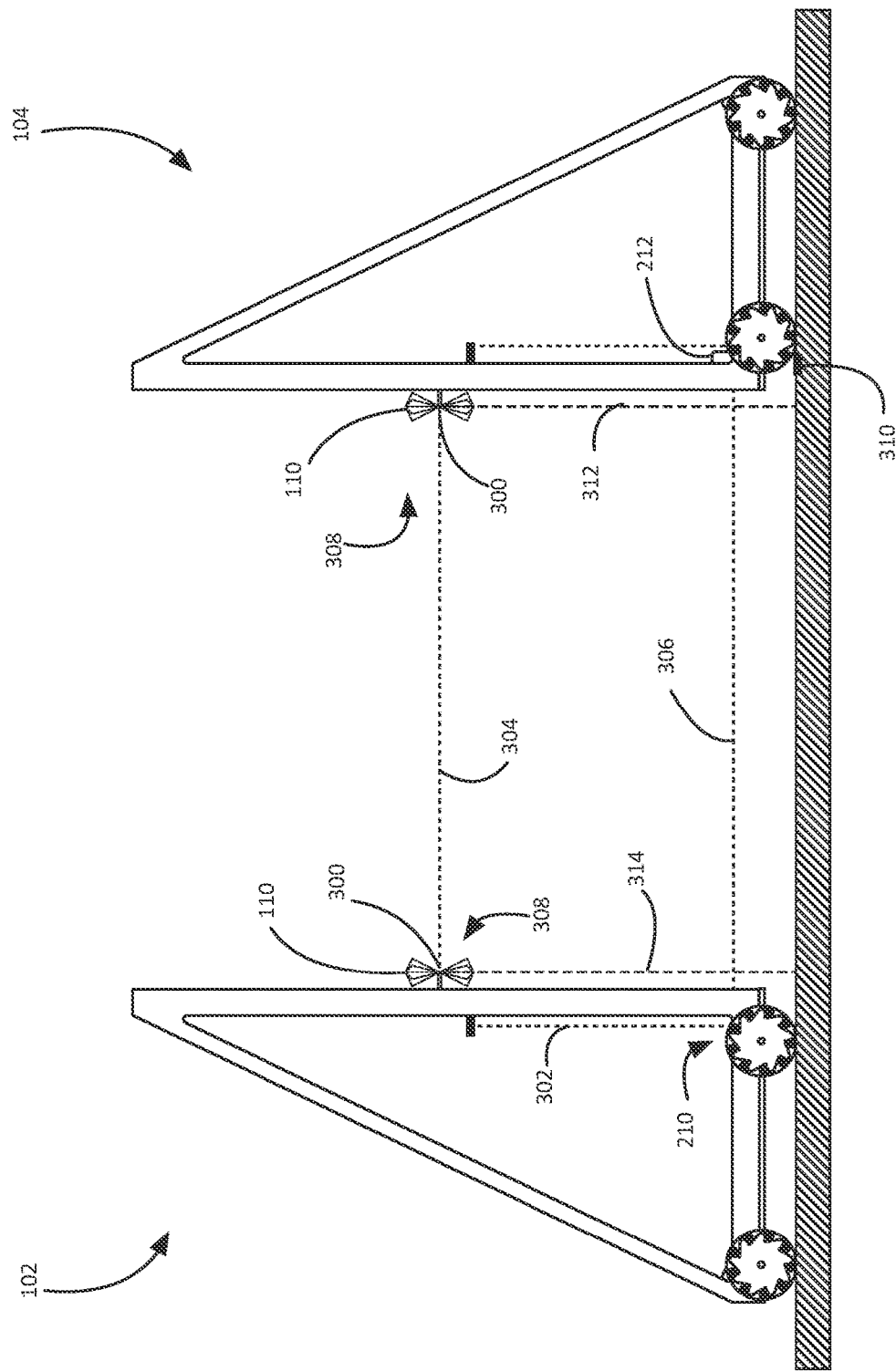
FIG. 3 is a side view of transmit and receive assemblies within a semi-anechoic chamber.

FIG. 3 is a side view of non-limiting examples of transmit and receive assemblies within a semi-anechoic chamber 106. As shown, the transmit assembly 104 has been positioned at a location 310, as determined by the positioning sensor 212 of the transmit assembly 104. The antennas 110 have the same polarity 308.

As previously discussed, each assembly has a height sensor 210 configured to measure a height 302. In some implementations, the height 302 measured by the height sensor 210 may be the same as the height of the measurement point 300 of that assembly (e.g., the transmit height 312 is the height of the measurement point 300 of the antenna 110 coupled to the antenna mount 202 of the transmit assembly 104, the receive height 314 is the height of the measurement point 300 of the antenna 110 coupled to the antenna mount 202 of the receive assembly 102). In other implementations, the height 302 measured by the height sensor 210 is different from the height of the measurement point 300. In some implementations, this can be an important distinction.

If the two assemblies are identical in every way, then it wouldn't matter if the height 302 measured by the height sensor 210 is the same as the height of the measurement point 300 or not. So long as the height sensors 210 return the same value, the measurement points 300 will be at the same height, according to some implementations. However, if the two assemblies are not absolutely identical (e.g., variations in actual elevation of height sensor 210 with respect to the floor, the transmit assembly 104 and receive assembly 102 were taken from two different sets and were not paired together at the time of manufacture, etc.), then the height 302 measured by the height sensor 210 of one assembly would need to be converted into a value that can be compared to that value measured in the other assembly.

Similarly, the measured separation 306 between the range finder 206 and the other assembly that is determined by the range finder 206 may be the same as the separation 304 between the measurement points 300 of the two assemblies in some implementations, and different in others. Using the separation 304 between measurement points 300 derived from the measured separation 306 obtained from the range finder 206 may facilitate the comparison of validation measurements taken for the same SAC 106 using different assemblies, according to various implementations.

Figure 4A:
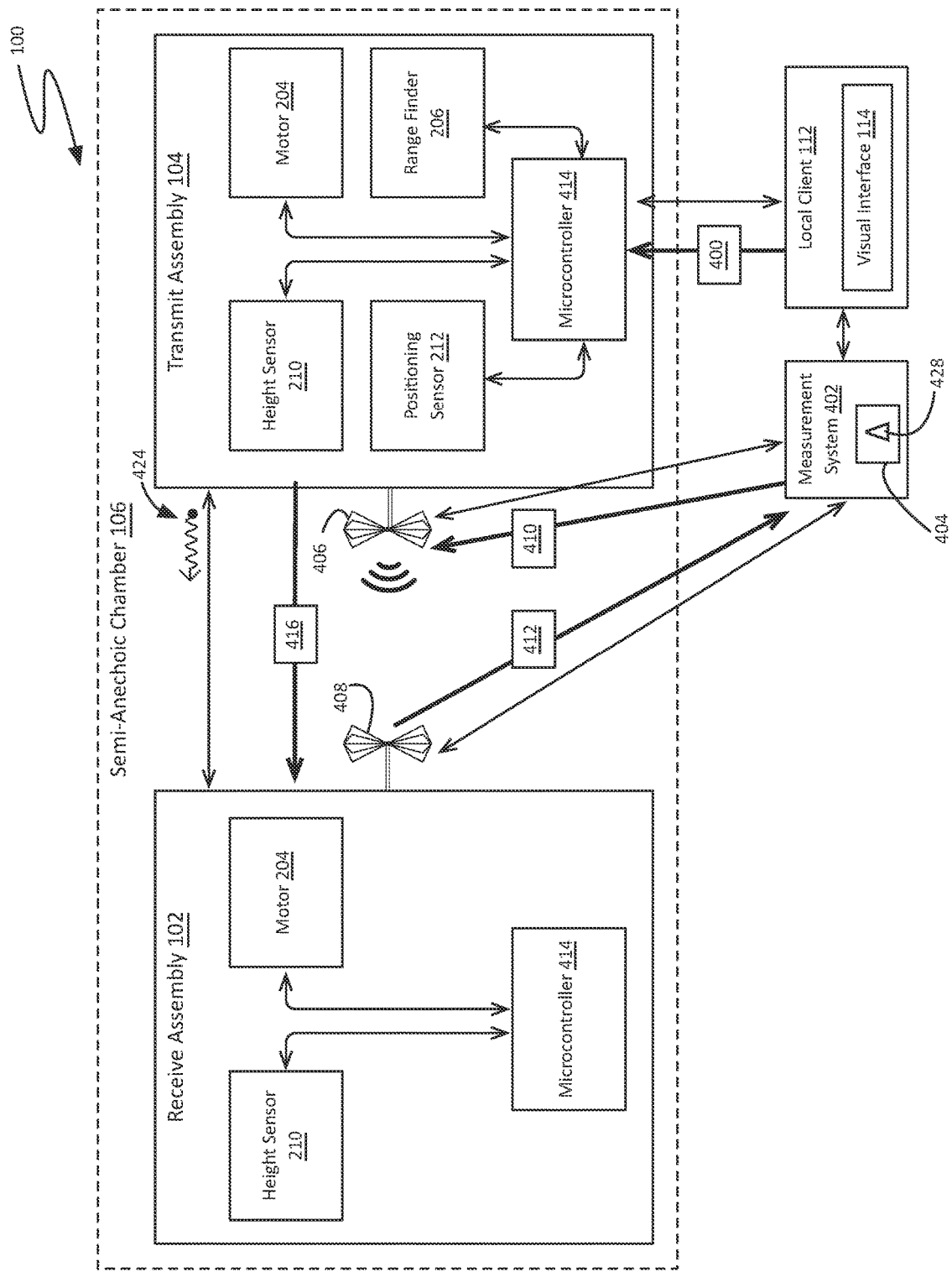
FIGS. 4A and 4B are schematic views of an automated validation system configured for local and remote operation, respectively.
Figure 4B:
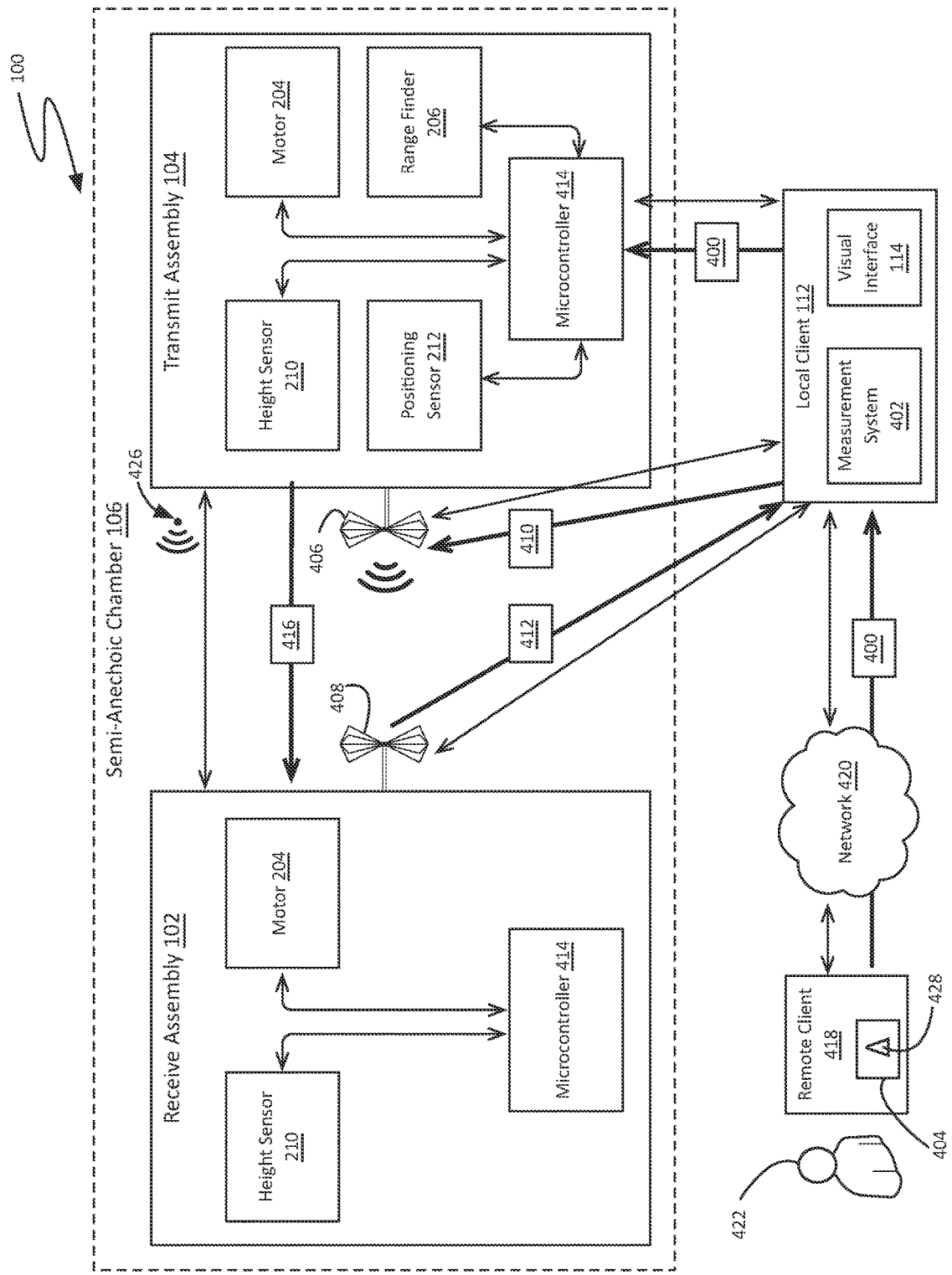

FIGS. 4A and 4B are schematic system views of non-limiting examples of an automated validation system 100 configured for local and remote operation, respectively. According to various implementations, an automated validation system 100 may comprise a transmit assembly 104, a receive assembly 102, and a local client 112. In some implementations, the system 100 may also comprise a measurement system 402. As shown, the local client 112 is communicatively coupled to the transmit assembly 104. More specifically, the local client 112 is communicatively coupled to a microcontroller 414 that is part of the transmit assembly 104.

The transmit assembly 104 and receive assembly 102 each have a microcontroller 414 that allow the assemblies to operate autonomously by acting on data received from other devices. According to various implementations, the microcontroller 414 of an assembly (e.g., transmit assembly 104, receive assembly 102) is communicatively coupled to the other electronic elements of that assembly, including but not limited to a height sensor 210, a range finder 206, a motor 204, and a positioning sensor 212.

As shown, the AVS 100 comprises a transmit antenna 406 that is releasably coupled to the antenna mount 202 of the transmit assembly 104, and a receive antenna 408 that is releasably coupled to the antenna mount 202 of the receive assembly 102. According to various implementations, the system 100 also comprises a measurement system 402. In the context of the present description and the claims that follow, a measurement system 402 is a device, a collection of devices, or a portion (hardware and/or software) of a device having additional functionalities. The measurement system 402 is configured to generate and analyze electrical signals. The measurement system 402 is communicatively coupled to both the transmit antenna 406 and the receive antenna 408. According to various implementations, the measurement system 402 is configured to send a signal (i.e., a validation input 410) to the transmit antenna 406 and receive a signal (i.e., a validation output 412) from the receive antenna 408 in response to the validation input 410 sent to the transmit antenna 406.

In some implementations, the measurement system 402 may be a subsystem or module within the local client 112. In other words, in some implementations, the local client 112 may comprise the measurement system 402. In other implementations, the measurement system 402 may be separate from, yet communicatively coupled to, the local client 112. In these implementations, the measurement system 402 may be communicatively coupled to the local client 112, and the local client 112 may be configured to control the measurement system 402, able to cause it to send a validation input 410 to the transmit antenna 406 and able to receive from the measurement system 402 the validation output 412 from the receive antenna 408, or an analysis of said validation output 412. As a specific example, in one implementation, the measurement system 402 may be commercially available, off-the-shelf equipment that may be controlled by proprietary software.

In still other implementations, the measurement system 402 (and the functionality it provides) may be divided between the transmit assembly 104 and the receive assembly 102 instead of concentrated in a single device located outside the SAC 106. For example, in one implementation, the capability to generate discrete frequencies of variable power may be integrated into the transmit assembly 104, and the capability to measure spectral energy may be integrated into the receive assembly 102.

One of the functions of the local client 112 is to provide the parameters needed by the transmit assembly 104 to autonomously validate the SAC 106. As shown, the local client 112 is configured to send a validation arrangement 400 to the microcontroller 414 of the transmit assembly 104. In the context of the present description and the claims that follow, a validation arrangement 400 represents a specific state of the transmit assembly 104 and receive assembly 102 inside of the SAC 106. More specifically, a validation arrangement 400 is a data object that defines (e.g., explicitly declares the values for the different parameters that make up the specific state within the semi-anechoic chamber 106) and/or describes (e.g., provides information such as the relative displacement from a previous location whose use results in the establishment of the specific state within the SAC 106 without explicitly stating the value of specific parameters such as location) various parameters that together resolve into a specific state yielding a desired validation point 124.

For example, in some implementations, a validation arrangement 400 may define and/or describe a validation location within the semi-anechoic chamber 106, a validation transmit height, a validation receive height, and a validation distance between the measurement points 300. In some implementations, a validation arrangement 400 may also define and/or describe a polarity 308 for the antennas 110.

As shown, the validation arrangement 400 is sent to the microcontroller 414 of the transmit assembly 104 as a data object. It should be noted that while a validation arrangement 400 is technically a data object, an ephemeral piece of digital information, the term validation arrangement may also be used to describe the resulting arrangement within the SAC 106 after the assemblies have rearranged themselves (e.g., "after the measurement is performed, the assemblies begin the transition from the first validation arrangement to the second validation arrangement", etc.). It should also be noted that while FIGS. 4A and 4B only show the transmission of a single validation arrangement 400 from the local client 112 to the transmit assembly 104, in some implementations the local client 112 may send all of the validation arrangements 400 needed to yield the validation points 124 needed to characterize the test volume 108 of interest, per established regulations. Of course, in other implementations, the local client 112 may send validation arrangements 400 one at a time, waiting to send a new validation arrangement 400 until the validation measurement 404 of the preceding validation arrangement 400 has been performed. This should not be inferred to make the system 100 any less autonomous; the local client 112 may be configured to automatically send the next validation point 124 upon receipt of the validation measurement 404.

According to various implementations, the assemblies within the SAC 106 maintain a communication link to each other that is either non-metallic or wireless. As shown, the microcontroller 414 of the receive assembly 102 is communicatively coupled to the microcontroller 414 of the transmit assembly 104, according to various implementations. In some implementations, the microcontrollers 414 of the two assemblies are communicatively coupled through a fiber optic link 424, while in other implementations they may be communicatively coupled through a wireless link 426.

Using said communication link, the transmit assembly 104 communicates with the receive assembly 102 or, more specifically, the microcontrollers 414 of the two assemblies communicate to maintain proper angular, height, polarity, and distance relationships between the assemblies. According to various implementations, the microcontroller 414 of the transmit assembly 104 is configured to receive the validation arrangement 400 from the local client 112, implement it, and then send an instruction 416 to the microcontroller 414 of the receive assembly 102.

According to various implementations, the instruction 416 is a data object describing and/or declaring a validation distance (i.e., desired separation between the two assemblies, or between the two measurement points 300) and a validation receive height (i.e., the height the receive antenna 408 needs to implement the validation arrangement 400). Additionally, according to various implementations the microcontroller 414 of the receive assembly 102 is configured to receive the instruction 416 from the microcontroller 414 of the transmit assembly 104, and then implement it.

In the context of the present description and the claims that follow, a validation measurement 404 is the result or measurement associated with a validation point 124 as a consequence of sending a validation input 410 to the transmit antenna 406. According to various implementations, the validation measurement 404 is based, at least in part, on a difference 428 between the validation input 410 and the validation output 412. Those skilled in the art will recognize that, just as the contemplated automated validation system 100 can be applied to different types of validation as well as tasks beyond validation, the validation measurement 404 derived from the validation output 412 (e.g., the result associated with the measurement point 300 of the transmit antenna 406 after implementing a validation arrangement 400 and sending it a validation input 410) may be calculated in different ways and/or depend on additional or different factors and values, according to various implementations.

In some implementations, the local client 112 is configured to instruct the measurement system 402 to obtain a validation measurement 404 corresponding to the validation arrangement 400 provided to the transmit assembly 104. As an option, in some implementations the local client 112 may not cause the measurement system 402 to proceed with obtaining the validation measurement 404 until after it has received an indication from the transmit assembly 104 that the validation arrangement 400 has been implemented within the SAC 106, and that the assemblies are ready for the validation measurement 404 to be obtained (e.g., transmit assembly 104 at the desired location 310, receive assembly 102 separated from the transmit assembly 104 by the desired distance, motors 204 powered off, etc.).

According to various implementations, the contemplated AVS 100 is not only well-adapted for the validation of a semi-anechoic chamber 106, it may also be used for tasks that would not be practical if attempted using traditional methodologies. For example, in some implementations, the AVS 100 may be utilized to map out a quiet zone that meets a certain criteria (e.g., "no more than a 6 dB difference between direct and indirect paths at 18 GHz", etc.). Such knowledge may be useful for pre-compliance testing, where a device is being evaluated to see if it is ready to be sent to an accredited lab for official testing. In such circumstances, knowledge about the actual environment that exists within a SAC 106 may assist in using an SAC 106 outside of the range of its "official" quiet zone.

As a specific non-limiting example, a device that is 1.5 m in size is being evaluated, to see if it is ready to be sent to a lab for official testing. It will need to be sent away rather than certified in-house because the only semi-anechoic chambers 106 available have 1 m turntables 120. It would be beneficial to know if the device will pass certification before incurring the expense and delay of sending it to another lab. In such a circumstance, it would be very beneficial to know the true extent and nature of the actual quiet zone within the semi-anechoic chambers 106 that are available. In this specific example, the question becomes, "how bad is this SAC 106 at 1.5 m?".

According to various implementations, the AVS 100 may be used to automatically probe and measure quiet zones of any size or shape within a SAC 106, as well as automatically move about the chamber taking readings to determine the size and shape of a test volume 108 that satisfies a particular criteria. Returning to the specific example, the AVS 100 may be utilized to investigate the nature of a test volume 108 at 1.5 m. The local client 112 provides the transmit assembly 104 the necessary validation arrangements 400 yielding validation points 124 that carve out a 1.5 m test volume 108. In this specific example, it is observed that at 1.5 m, the validation measurements 404 are, at most, 1 dB worse than they are at the edge of the "official" 1 m quiet zone. Thus, if the 1.5 m device passes by more than 1 dB in this 1 m SAC 106, it should pass certification in a SAC 106 validated to have a quiet zone at least 1.5 m in size, and should be sent to a lab having the needed equipment to make it official. The ability to automatically characterize a SAC 106 using the AVS 100 allows for the discovery and mapping of a multitude of quiet zones that satisfy criteria that are different than the criteria defined by regulation, which may be useful in various, specific use cases such as the previous specific example.

Furthermore, the ability to "find the zone" may also be useful in repurposing older semi-anechoic chambers 106 that might otherwise sit dormant. For example, a SAC 106 may be used to perform tests other than emission testing. As a specific non-limiting example, a lab may have a SAC 106 that is old and not in the best of shape (i.e., no longer fit for emission testing). Rather than let this multi-million dollar piece of equipment sit idle, it can be repurposed for another use, such as immunity testing (i.e., determining how much noise a device can tolerate). In order to use this SAC 106 for immunity testing, it is important to understand the degree of field uniformity within the chamber, so it is known how big the EUT can be. The contemplated AVS 100 can be used to automatically map out the field uniformity, using the same methods discussed above for validating a quiet zone.

The ability to map out the actual quiet zone inside a SAC 106 may also assist in determining if a different sized turntable 120 would be more appropriate. For example, a chamber may have a 3 m turntable 120 and it may be discovered that the quiet zone is only 2.8 m. Also, this functionality may be beneficial when used in other types of chambers, such as a reverb chamber. Additionally, autonomous quiet zone characterization allows for the determination of the true shape of the quiet zone, which is traditionally assumed to be circular. In reality, the true quiet zone may have a variety of non-circular shapes (e.g., triangle, trapezoid, higher order polygons, etc.) for a variety of reasons.

FIG. 4A is a schematic system view of a non-limiting example of an automated validation system 100 being operated remotely. As shown, this system 100 further comprises a remote client 418 that is communicatively coupled to the local client 112 through a network 420 (e.g., the Internet, etc.). The remote client 418 is being operated by a certified user 422, an individual who is licensed and affiliated with an accredited agency such that they can perform official validation tests on a SAC 106 to be used for official certification of devices as being fit for public use. A significant part of the expense in the traditional approach to chamber validation is the travel and housing expenses for these individuals that are required for validation that satisfies regulator constraints. The AVS 100 is advantageous over conventional methodologies because it allows a certified user 422 to perform the validation testing without the associate expenses in travel, housing, and time.

In the context of the present description and the claims that follow, a remote client 418 is simply a computing device, similar to the local client 112, that is configured to interact with the rest of the AVS 100 over a network 420, using the local client 112 as a gateway to the assemblies and measurement system 402. According to various implementations, the local client 112 is configured to receive a plurality of validation arrangements 400 from the remote client 418 that have been selected by a certified user 422 through the remote client 418 (e.g., the certified user 422 selects the parameters of the test such as the number of validation points 124, where they are located, what separation 304 is to be used, etc.). The local client 112 is also configured to send the resulting plurality of validation measurements 404 to the remote client 418. As an option, in some implementations the local client 112 may bypass the visual interface 114, and send the validation measurements 404 to the remote client 418 instead of displaying them locally, at least until they have been received and reviewed by the certified user 422 (e.g., the test volume 108 has been validated or deemed a failure by the certified user 422).

As previously discussed, the ability for some implementations of the AVS 100 contemplated herein to be operated remotely opens up the possibility for the owner of the semi-anechoic chamber 106 to rent the AVS 100 instead of purchasing it. As a specific, non-limiting example, the equipment of the AVS 100 (e.g., the assemblies, the local client 112, etc.) is shipped to the site of the SAC 106. The transmit assembly 104 and receive assembly 102 are put together, placed in the SAC 106, and connected to a power supply, the local client 112, the measurement system 402, etc. The assemblies are placed in a starting position chosen by the certified user 422, or chosen by the local user and indicated to the remote client 418 via the local client 112, according to various implementations. After establishing the initial separation 304 using the range finder 206 (or moving the assemblies such that the separation 304 has a specific value, in some implementations), the local user seals the chamber 106 and indicates, via the local client 112, that everything is ready for the validation testing. The certified user 422 then performs the testing through the AVS 100, over the network 420 via the remote client 418.

FIGS. 5A-5E are schematic top views of a non-limiting example of an automated validation system 100 at different stages of the automated validation process. Specifically, FIGS. 5A-5E show the steps taken by an automated validation system 100 to autonomously adjust the system 100 in preparation for the acquisition of a validation measurement 404.

It should be noted that the sequence of steps shown in FIGS. 5A-5E do not include the actions taken to prepare the system 100 to validate a semi-anechoic chamber 106, nor do they include the acquisition of the first validation measurement 404. FIGS. 5A-5E show the steps taken to execute a validation arrangement 400, starting from a previously executed validation arrangement 400 (i.e., the configuration of AVS 100 elements within the SAC 106 that was the result of executing said validation arrangement 400).

According to various implementations, the AVS 100 is able to be deployed/installed with only a few steps. This simplicity is particularly advantageous in applications where the AVS 100 is rented, shipped, and ultimately remotely operated. According to various implementations, the system 100 may be deployed by simply moving the transmit assembly 104 and receive assembly 102 into the semi-anechoic chamber 106, while the local client 112 is placed outside the SAC 106 and provided power. In some implementations where the measurement system 402 is a discrete device separate from the local client 112, it is communicatively coupled to the local client 112. The transmit assembly 104 is communicatively coupled to the local client 112. For example, in one implementation, conductive or fiber optic cabling passed through a conduit running from outside the SAC 106, beneath the floor of the SAC 106, and then up out of a small opening in the turntable 120, as is known in the art. Additionally, the measurement system 402 is communicatively coupled to the transmit antenna 406 and the receive antenna 408, using any method known in the art for establishing communications with an antenna 110 inside a SAC 106. In implementations where the two assemblies communicate via fiber optic link 424, the microcontroller 414 of the transmit assembly 104 is communicatively coupled to the microcontroller 414 of the receive assembly 102 through the fiber optic.

In some implementations, the transmit assembly 104 is manually relocated to a set starting position, such as the "front" position on the turntable 120 (i.e., the position on the turntable 120 that is closest to the receive assembly 102) or centered on the turntable 120. As an option, in one implementation, the technician setting up the system 100 may be informed via the visual interface 114 of the local client 112 where the local client 112 expects the transmit assembly 104 to be at the start of the validation. In other implementations, the transmit assembly 104 may be manually relocated to any starting position, so long as the starting position is communicated to the local client 112 so it knows where the transmit assembly 104 is.

In still other implementations, the transmit assembly 104 may be configured to relocate itself to the starting position, using the positioning sensor 212 to navigate. In some implementations, the transmit assembly 104 must be placed in the vicinity of an indicated starting position (e.g., a landmark 122 indicating the starting position is within detection range of the positioning sensor 212), and then the transmit assembly 104 makes the final adjustments, guided by the positioning sensor 212, until the transmit assembly 104 has arrived at the indicated starting position (e.g., a location 310 that is both identified by the local client 112 and detectable to the positioning sensor 212, etc.).

Before the automated validation of the SAC 106 can commence, the local client 112 must have enough information about the SAC 106 being validated, according to various implementations. In some implementations, the local client 112 may obtain the needed information from someone on-site (e.g., using prompts on the visual interface 114, etc.). In other implementations, the system 100 may attempt to determine as much information as it can using the various devices available to the local client 112 (e.g., the transmit assembly 104, the receive assembly 102, a detected measurement system 402, additional sensors, etc.), and then prompt a technician to provide information and parameters the system 100 was unable to obtain by itself.

Examples of information and parameters that may be needed by the local client 112 include, but are not limited to, a desired separation 304 distance between the measurement points 300 of the assemblies (e.g., 3 m, 10 m, etc.), which locations within the SAC 106 should be used as validation points 124 (i.e., validation locations 502), the desired network analyzer or measurement system 402 (if more than one is available or the measurement system 402 is unable to identify itself to the local client 112), the identity of the transmit assembly 104 and receive assembly 102 being used, whether or not the validation is to be automated (e.g., if manual validation is indicated, the local client 112 may prompt a technician every time it would move the assemblies), the type of measurements to be performed (e.g., frequency range for emission testing, field uniformity testing, shielding effectiveness, "find the quiet zone", etc.), the regulatory standard that is to be satisfied (e.g., different standards have different requirements and simply identifying the standard can reveal a number of other parameters, etc.), specific antenna paths to use, and any other testing or validation parameters known in the art.

In some implementations, the local client 112 may request, or provide human-readable instructions for, the calibration of the SAC 106 with the deployed assemblies. In the context of the present description and the claims that follow, calibration of the chamber 106 means the process of removing the effect of any cables, amplifiers, or the like, that is in the path, as well as correcting for cable loss and/or amplifier gain (in some cases with some antennas), and the like. Calibration is a step commonly done in conventional validation and other SAC 106 activities. According to various implementations, the AVS 100 combined with the SAC 106 is able to be calibrated using conventional techniques. In some implementations, the AVS 100 may be configured to automatically perform the proper calibrations.

Once the AVS 100 has been deployed, the testing parameters established, and the setup calibrated, the automated validation of the SAC 106 may be started, triggered by human input. In some implementations, this may be the last human intervention needed to perform the validation or other test, barring some sort of equipment malfunction or unforeseen circumstance.

Figure 5A:
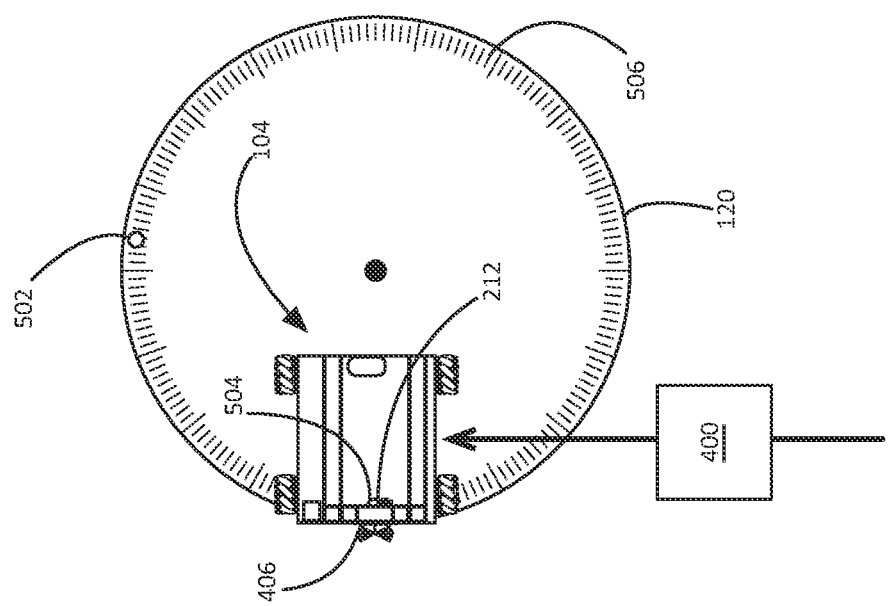
Figure 5A:
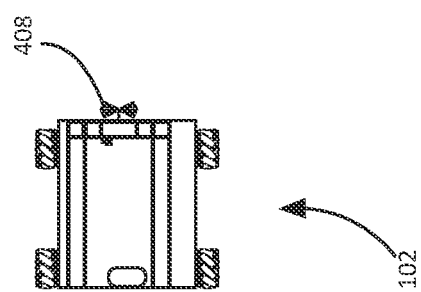

FIG. 5A shows the local client 112 sending a validation arrangement 400 to the microcontroller 414 of the transmit assembly 104. It should be noted that while this shows a single validation arrangement 400 being sent and that in some implementations the validation arrangements 400 are sent one at a time, waiting for the previous validation measurement 404 to be obtained, in some implementations the local client 112 may send a plurality of validation arrangements 400 to the microcontroller 414 of the transmit assembly 104. As an option, in some implementations, the microcontroller 414 of the transmit assembly 104 may be configured to receive a plurality of validation arrangements 400 and order them in a more efficient sequence of transformations and translations within the SAC 106.

As previously discussed, the validation arrangement 400 is a data object defining and/or describing a specific state of the SAC 106. According to various implementations, the validation arrangement 400 may describe and/or define a validation location 502 within the semi-anechoic chamber 106, a validation transmit height 500, a validation receive height 508, and a validation distance 510 between the assemblies. In some implementations, the validation arrangement 400 may also include a polarity 308. In some implementations, each validation arrangement 400 may define and/or describe every aspect of the specific arrangement within the SAC 106. In other implementations, the local client 112 may provide validation arrangements 400 to the microcontroller 414 of the transmit assembly 104 that only specify the aspects that must be changed. As a specific example, in one implementation, if a validation arrangement 400 is executed within the SAC 106 that specified a validation transmit height 500, subsequent validation arrangements 400 for validation points 124 at that same height would not specify the validation transmit height 500, since it is not changing. When the next validation point 124 is to have a different height, the associated validation arrangement 400 will include the new validation transmit height 500.

In some implementations, when the test or characterization being performed takes into account standing waves within the semi-anechoic chamber 106 and, for each position being examined, a sequence of validation locations 502 yield validation measurements 404 (e.g., a sequence of linear advances in irregular intervals based on a wavelength, etc.), the sequence of points may be specified with a validation arrangement 400 being created and transmitted for each point. In other implementations, the validation arrangement 400 may indicate parameters for the consideration of standing waves (e.g., wavelength, number of segments, partitioning of linear sequence, etc.), and the microcontroller 414 of the transmit assembly 104 may be configured to implement a sequence of specific states within the chamber 106 based on that information. In still other implementations, the transmit assembly 104 may be ignorant of what the big picture is and simply execute the validation arrangement 400 it receives, never considering why that point was specified or what will be examined next.

Figure 5B:
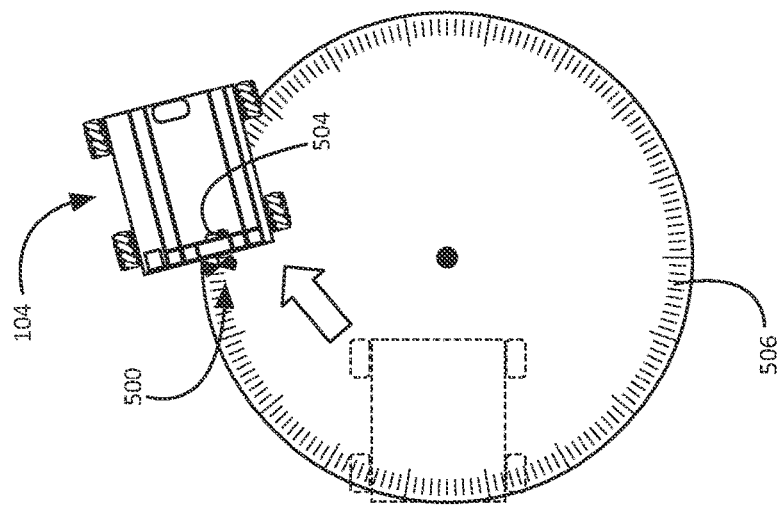
Figure 5B:
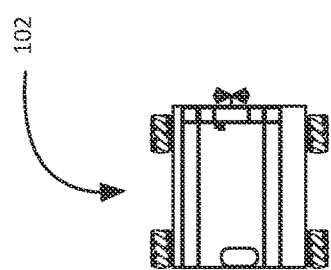

As shown in FIG. 5B, in some implementations, the positioning sensor 212 may be an optical line reader 504 configured to follow a path 506 within the semi-anechoic chamber 106. In some implementations, the path 506 may be a structural aspect of the chamber (e.g., the edge of the turntable 120, etc.). In other implementations, the path 506 may be a line or pattern that has been applied to, or is discernable by the positioning sensor 212 upon (e.g., a pattern drawn in UV-reactive ink that is visible to the positioning sensor 212), one or more surfaces within the SAC 106. In some implementation, the path 506 may be integral with the SAC 106, having been included at the time the SAC 106 was created and installed. In other implementations, the SAC 106 may be retrofit to include the path 506. As a specific example, in some implementations the positioning sensor 212 may be sensitive to markings (e.g., a path, an Anoto dot pattern, etc.) that have been made integral with the turntable 120. A SAC 106 may be easily retrofit to be compatible with the positioning sensor 212 by simply replacing the turntable 120 with one that comprises the landmark 122.

FIG. 5B shows the microcontroller 414 of the transmit assembly 104 executing at least a portion of the validation arrangement 400 it received from the local client 112. Specifically, in this non-limiting example, the transmit assembly 104 moves to the specified validation location 502, guided by the positioning sensor 212, and also moves the antenna mount 202 to place the measurement point 300 of the transmit antenna 406 at the specified validation transmit height 500, as guided by the height sensor 210. In some implementations, the microcontroller 414 of the transmit assembly 104 is also configured to orient the transmit assembly 104 within the semi-anechoic chamber 106 such that the transmit antenna 406 is pointed at the receive antenna 408 of the receive assembly 102. This is done to maintain the same signal path from point to point, throughout the validation, to the extent possible. In some implementations, the microcontroller 414 of the transmit assembly 104 is also configured to move the antenna mount 202 of the transmit assembly 104 such that the transmit antenna 406 assumes a polarity 308 received in the validation arrangement 400, with respect to the transmit assembly 104.

FIG. 5C shows the transmission of an instruction 416 to the receive assembly 102 so it can continue to execute the validation arrangement 400. Once the transmit assembly 104 is done moving according to the validation arrangement 400, the separation 304 is determined using the range finder 206, and an instruction 416 is sent to the receive assembly 102. According to various implementations, the microcontroller 414 of the transmit assembly 104 is configured to send an instruction 416 to the microcontroller 414 of the receive assembly 102. The instruction 416 describes and/or defines the validation distance 510 and the validation receive height 508, according to various implementations. In some implementations, the instruction 416 also describes and/or defines the polarity 308. It should be noted that this assumes that the range finder 206 is coupled to the transmit assembly 104. In implementations where the range finder 206 is coupled to the receive assembly 102, the instruction 416 would not include information based on the separation 304, but instead may indicate the target separation.

Figure 5D:
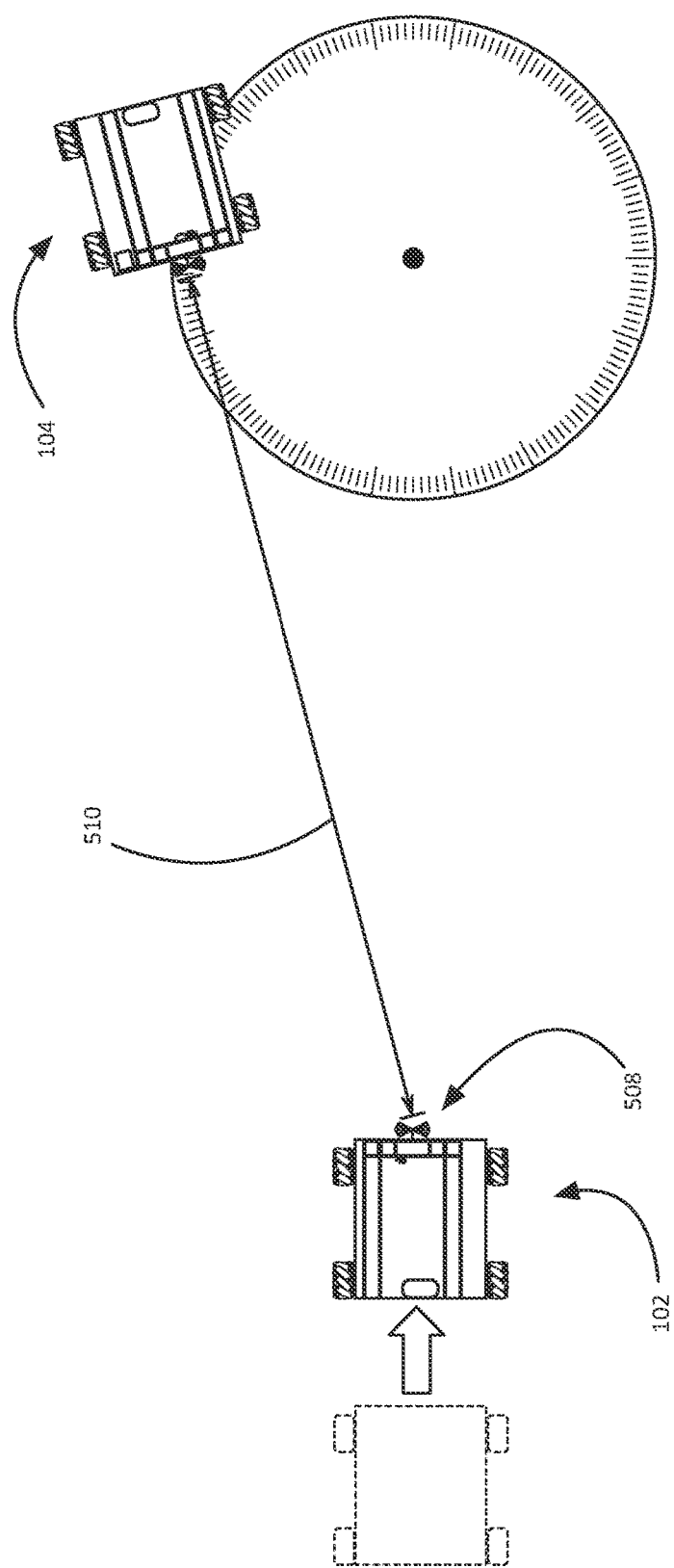

FIG. 5D shows the receive assembly 102 moving in response to receiving the instruction 416 from the transmit assembly 104. According to various implementations, the microcontroller 414 of the receive assembly 102 is configured to receive the instruction 416 from the microcontroller 414 of the transmit assembly 104, and move the antenna mount 202 of the receive assembly 102, guided by the height 302 measured by the height sensor 210 of the receive assembly 102, such that the measurement point 300 of the receive antenna 408 is at the validation receive height 508. The microcontroller 414 of the receive assembly 102 is also configured to drive the motor 204 to move the receive assembly 102 such that a separation 304 between the measurement point 300 of the transmit antenna 406 and the measurement point 300 of the receive antenna 408, as determined using the range finder 206, is restored to the validation distance 510. In some implementations, the microcontroller 414 of the receive assembly 102 is further configured to move the antenna mount 202 of the receive assembly 102 such that the receive antenna 408 assumes the polarity 308 of the transmit antenna 406. In some implementations, the microcontroller 414 of the receive assembly 102 is also configured to automatically reorient the antenna mount 202 with respect to the receive assembly 102 such that the receive antenna 408 is pointing directly at the transmit antenna 406.

Figure 5E:
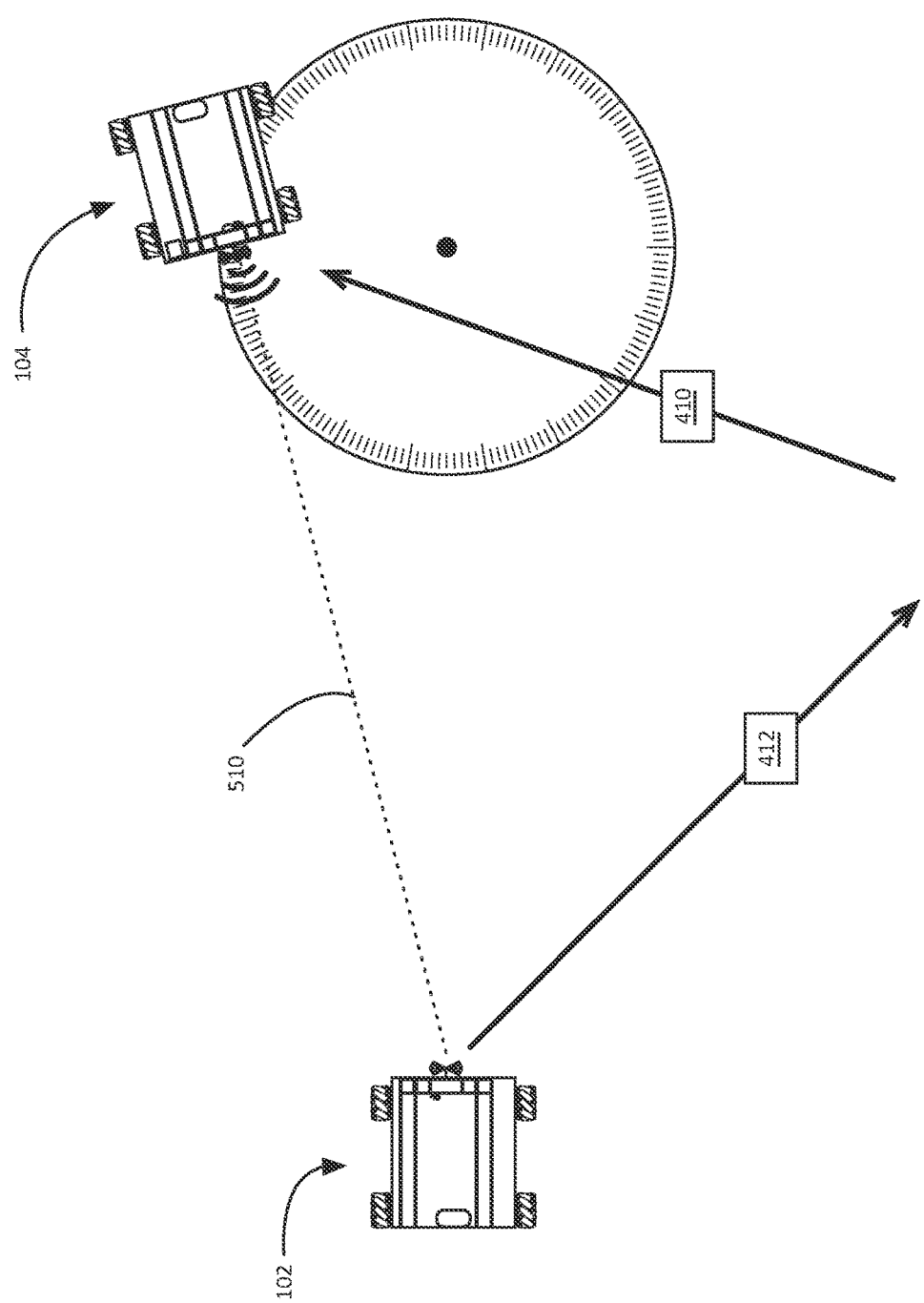

FIG. 5E shows the AVS 100 obtaining a validation measurement 404. According to various implementations, once the validation arrangement 400 has been executed within the semi-anechoic chamber 106, sensors and other devices (e.g., motors 204, etc.) are powered down, and the measurement system 402 sends a validation input 410 to the transmit antenna 406 and receives the resulting validation output 412 from the receive antenna 408, as previously discussed. In some implementations, the measurement system 402 may do this in response to a message sent to the local client 112 from the transmit assembly 104 indicating the AVS 100 elements within the semi-anechoic chamber 106 are in place and ready for the measurement.

Figure 6:
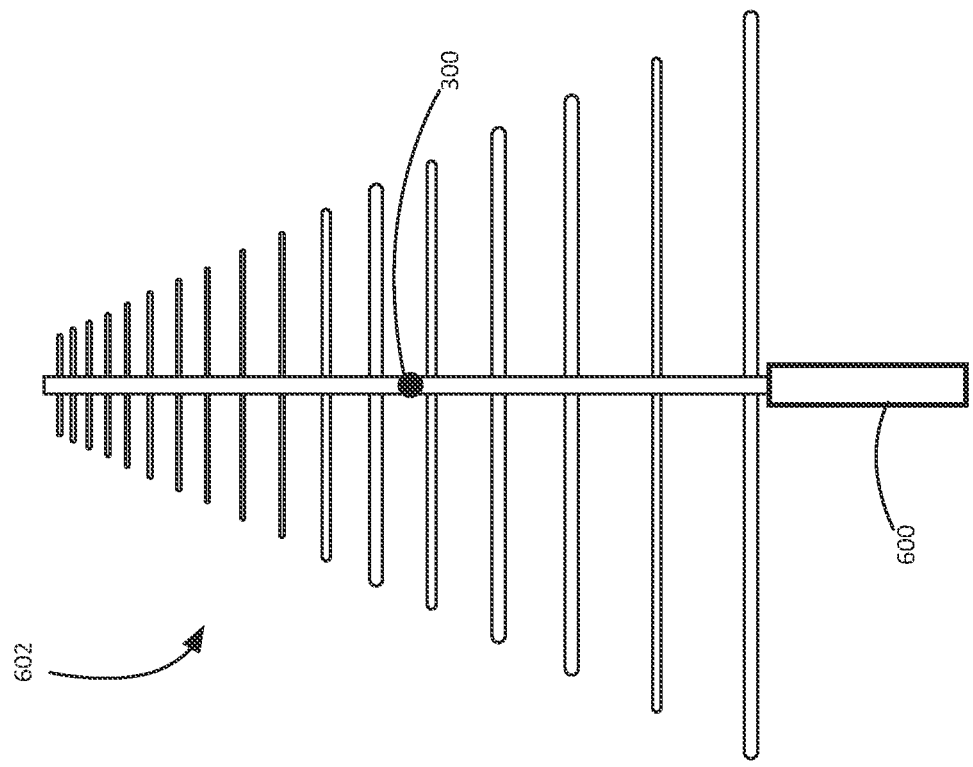
FIG. 6 is a front view of a plurality of antennas with antenna adapters.
Figure 6:
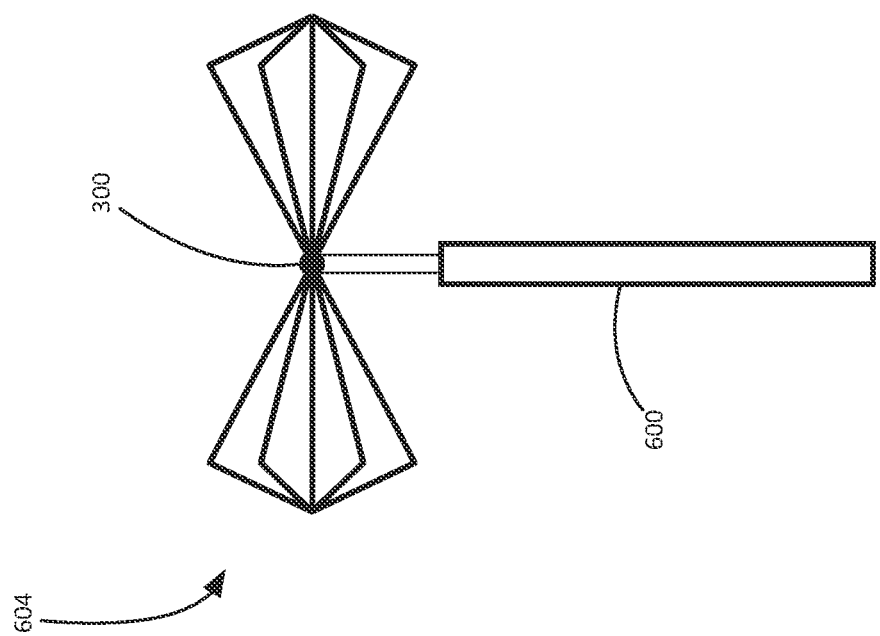

FIG. 6 is a front view of a plurality of antennas, each coupled to a non-limiting example of an antenna adapter 600. Specifically, FIG. 6 shows a biconical antenna 604 and a log periodic antenna 602, two different types of antennas 110 commonly used in EMC/EMI testing. Each of these antennas 110 is coupled to an antenna adapter 600 sized and shaped to receive that particular antenna 110. The antenna adapters 600 are also sized and shaped such that they can be received by, and releasably coupled to, an antenna mount 202, according to various implementations.

Different antennas 110 are used to perform different tests and/or operate within different frequency ranges, as is known in the art. In the process of validating a semi-anechoic chamber 106 over a wide range of frequencies, as is common, multiple antennas will be used. Because these antennas 110 will have different shapes and sizes, simply mounting them to the antenna mount 202 will result in measurement points 300 being located in different locations and at different heights, even when nothing else in the system 100 has changed. The antenna adapters 600 bring needed uniformity back to the system 100.

As shown, each antenna adapter 600 is sized and shaped to couple to a different antenna 110 from a plurality of antennas 110 such that the measurement point 300 of every antenna 110 is located at the same point relative to the antenna mount 202 when the associated antenna adapter 600 is releasably coupled to the antenna mount 202. The antenna adapters 600 facilitate the rapid swapping of antennas 110, a task best suited to humans able to easily carry antennas 110 into and out from the semi-anechoic chamber 106. While this would be a convenience in a conventional chamber validation methodology, it is even more beneficial when the system 100 is automated.

The use of these adapters is advantageous in the contemplated automated validation system 100 because, by keeping the antenna measuring point in a fix position relative to the antenna mount 202, the system 100 (specifically, the height and separation evaluation subsystems) does not have to be offset or otherwise adjusted every time the antenna 110 is swapped.

In some implementations, the antenna adapters 600 may also make it possible for the system 100 to automatically detect what type of antenna 110 is currently being used and, in some implementations, adjust its behavior accordingly. As a specific example, in one implementation, when the system 100 detects a new antenna 110, the local client 112 may ensure the parameters being sent to the transmit assembly 104 and the measurement system 402 are those specific for that type of antenna 110. In some implementations, the antenna adapters 600 may also include a mechanism configured for changing and/or sensing the antenna polarity 308. In other implementations, the assemblies may be configured to automatically detect the offset of the measurement point 300 (e.g., using cameras, machine vision, and a knowledge of the various types of antennas that could show up in the antenna mount 202), and adjust the measurements and calculations accordingly.

Where the above examples, implementations and implementations reference examples, it should be understood by those of ordinary skill in the art that other systems and methods for the automated validation of a semi-anechoic chamber could be intermixed or substituted with those provided. In places where the description above refers to particular implementations of a system and method for the automated validation of a semi-anechoic chamber, it should be readily apparent that a number of modifications may be made without departing from the spirit thereof and that these implementations and implementations may be applied to other validation and characterization technologies as well. Accordingly, the disclosed subject matter is intended to embrace all such alterations, modifications and variations that fall within the spirit and scope of the disclosure and the knowledge of one of ordinary skill in the art.

What is claimed is:

1. A method for the automated validation of a semi-anechoic chamber comprising:
   receiving a validation arrangement at a microcontroller of a transmit assembly, the validation arrangement comprising a validation location within the semi-anechoic chamber and a validation transmit height, the transmit assembly further comprising a mast and a motor communicatively coupled to the microcontroller of the transmit assembly;
   autonomously moving the transmit assembly within the semi-anechoic chamber such that the transmit assembly is at the validation location and a measurement point of a transmit antenna releasably coupled to the transmit assembly is at the validation transmit height;
   sending an instruction to a microcontroller of a receive assembly also within the semi-anechoic chamber, the instruction comprising a validation distance and a validation receive height, the receive assembly further comprising a mast and a motor communicatively coupled to the microcontroller of the receive assembly;
   autonomously moving the receive assembly within the semi-anechoic chamber such that the measurement point of a receive antenna releasably coupled to the receive assembly is at the validation receive height and the measurement point of the transmit antenna is separated from the measurement point of the receive antenna by the validation distance; and
   obtaining a validation measurement corresponding to the validation arrangement using a measurement system communicatively coupled to the transmit antenna and the receive antenna.

2. The method of claim 1, wherein the instruction is autonomously sent by the transmit assembly to the receive assembly.

3. The method of claim 2, the validation arrangement further comprising the validation distance and the validation receive height.

4. The method of claim 1, further comprising:
   sending the validation arrangement to the transmit assembly from a local client outside the semi-anechoic chamber;
   wherein the local client instructs the measurement system to obtain the validation measurement after the transmit assembly and receive assembly are positioned according to the validation arrangement.

5. The method of claim 4, further comprising receiving the validation arrangement at the local client from a remote client, the validation arrangement having been selected by a certified user operating the remote client.

6. The method of claim 5, further comprising sending the validation measurement to the remote client, bypassing any visual interface of the local client.

7. The method of claim 1, the transmit assembly further comprising a positioning sensor configured to determine a location of the transmit assembly relative to one of a landmark or the semi-anechoic chamber; and
   wherein autonomously moving the transmit assembly comprises the transmit assembly being autonomously guided by the positioning sensor to the validation location.

8. The method of claim 7, wherein the positioning sensor is an optical line reader configured to follow a path within the semi-anechoic chamber.

9. The method of claim 1:
wherein the transmit assembly and receive assembly each comprise a height sensor;
wherein autonomously moving the transmit assembly comprises moving the transmit antenna vertically until the measurement point of the transmit antenna is at the validation transmit height as determined by the height sensor of the transmit assembly; and
wherein autonomously moving the receive assembly comprises moving the receive antenna vertically until the measurement point of the receive antenna is at the validation receive height as determined by the height sensor of the receive assembly.

10. The method of claim 1, wherein one of the receive assembly or the transmit assembly further comprises a range finder configured to determine a measured separation between the range finder and the other of the receive assembly and the transmit assembly, and wherein autonomously moving the receive assembly comprises using the measured separation determined by the range finder to separate the measurement points of the receive antenna and transmit antenna by the validation distance.

11. The method of claim 1, wherein the mast of the transmit assembly and the mast of the receive assembly are composed of a thermoplastic.

12. The method of claim 1, wherein the motor of the transmit assembly and the motor of the receive assembly are both pneumatic motors comprising a thermoplastic.

13. The method of claim 1:
wherein the transmit assembly and the receive assembly each comprise a plurality of wheels;
wherein autonomously moving the transmit assembly comprises driving the motor of the transmit assembly to turn the wheels of the transmit assembly; and
wherein autonomously moving the receive assembly comprises driving the motor of the receive assembly to turn the wheels of the receive assembly.

14. The method of claim 13, wherein the plurality of wheels of the transmit assembly are mechanum wheels.

15. The method of claim 1, wherein the transmit assembly is configured to autonomously relocate within the semi-anechoic chamber through movement in two dimensions.

16. The method of claim 15, wherein the receive assembly is configured to autonomously relocate within the semi-anechoic chamber through movement confined to one dimension.

17. The method of claim 1:
wherein the validation arrangement corresponds to a validation point located within the semi-anechoic chamber at the measurement point of the transmit antenna once the validation arrangement has been implemented;
wherein a test volume within the semi-anechoic chamber is validated using a plurality of validation measurements, the test volume being bound by a plurality of validation points corresponding to a plurality of validation arrangements that correspond to the plurality of validation measurements.

18. The method of claim 1:
wherein obtaining the validation measurement using the measurement system comprises:
sending a validation input from the measurement system to the transmit antenna; and
receiving, by the measurement system, a validation output from the receive antenna in response to the validation input sent to the transmit antenna;
wherein the validation measurement is based at least in part on a difference between the validation input and the validation output.

19. A method for the automated validation of a semi-anechoic chamber comprising:
sending a validation arrangement to a transmit assembly inside the semi-anechoic chamber, the validation arrangement defining at least a validation point and a validation distance, the transmit assembly comprising a mast, a motor, and a microcontroller;
autonomously moving the transmit assembly and a receive assembly within the semi-anechoic chamber such that a measurement point of a transmit antenna releasably coupled to the transmit assembly is positioned at the validation point, and the measurement point of a receive antenna releasably coupled to the receive assembly is separated from the validation point by the validation distance, the receive assembly also comprising a mast, a motor, and a microcontroller; and
obtaining a validation measurement corresponding to the validation arrangement using a measurement system communicatively coupled to the transmit antenna and the receive antenna;
wherein the transmit assembly is communicatively coupled to the receive assembly.

20. The method of claim 19:
wherein the transmit assembly further comprises a positioning sensor configured to determine a location of the transmit assembly relative to one of a landmark or the semi-anechoic chamber; and
wherein autonomously moving the transmit assembly comprises the transmit assembly moving autonomously guided by the positioning sensor until the measurement point of the transmit antenna is at the validation point.

* * * * *